United States Patent
Pan et al.

(10) Patent No.: US 7,112,480 B2
(45) Date of Patent: Sep. 26, 2006

(54) METHOD AND STRUCTURE FOR A LOW VOLTAGE CMOS INTEGRATED CIRCUIT INCORPORATING HIGHER-VOLTAGE DEVICES

(75) Inventors: Shanjen Pan, Plano, TX (US); James R. Todd, Plano, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/187,472

(22) Filed: Jul. 22, 2005

(65) Prior Publication Data

US 2006/0022278 A1 Feb. 2, 2006

Related U.S. Application Data

(62) Division of application No. 10/909,634, filed on Aug. 2, 2004, now Pat. No. 6,969,901.

(51) Int. Cl.
*H01L 21/8238* (2006.01)

(52) U.S. Cl. ...................... 438/199; 438/224; 438/228; 438/232

(58) Field of Classification Search ......... 438/199–232
See application file for complete search history.

(56) References Cited

U.S. PATENT DOCUMENTS

| | | | |
|---|---|---|---|
| 5,181,095 A | 1/1993 | Mosher et al. | |
| 5,256,582 A | 10/1993 | Mosher et al. | |
| 5,296,393 A | 3/1994 | Smayling et al. | |
| 2003/0190779 A1* | 10/2003 | Post et al. | 438/200 |

* cited by examiner

*Primary Examiner*—H. Jey Tsai
(74) *Attorney, Agent, or Firm*—Rose Alyssa Keagy; W. James Brady, III; Frederick J. Telecky, Jr.

(57) ABSTRACT

A CMOS integrated circuit (15A-B-C) includes both relatively low-power (124, 126) and high-power (132, 134) CMOS transistors on the same chip. A 20V, relatively high-power PMOS device (134) includes a heavily doped N-well drain region (70). A 20V, relatively high-power NMOS device (132) includes heavily doped P-type buried layers (76, 78) underneath the source (94) and drain regions (96) and spanning the gap between the P-well gate (90F) and adjacent P-well isolation regions (46, 50).

4 Claims, 23 Drawing Sheets

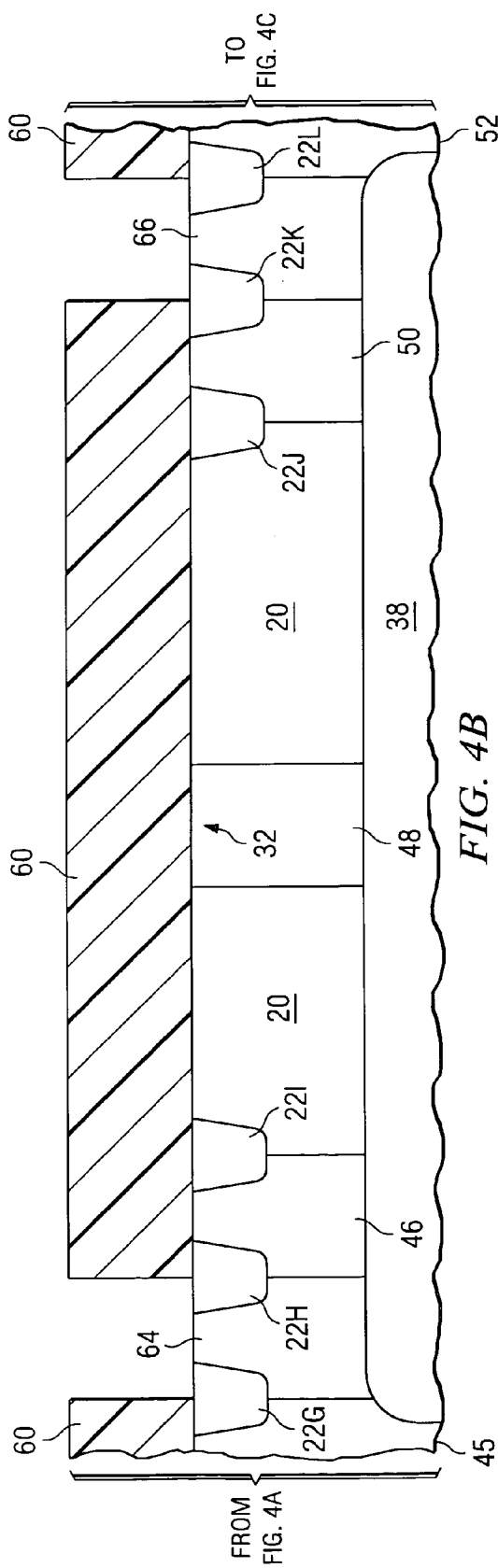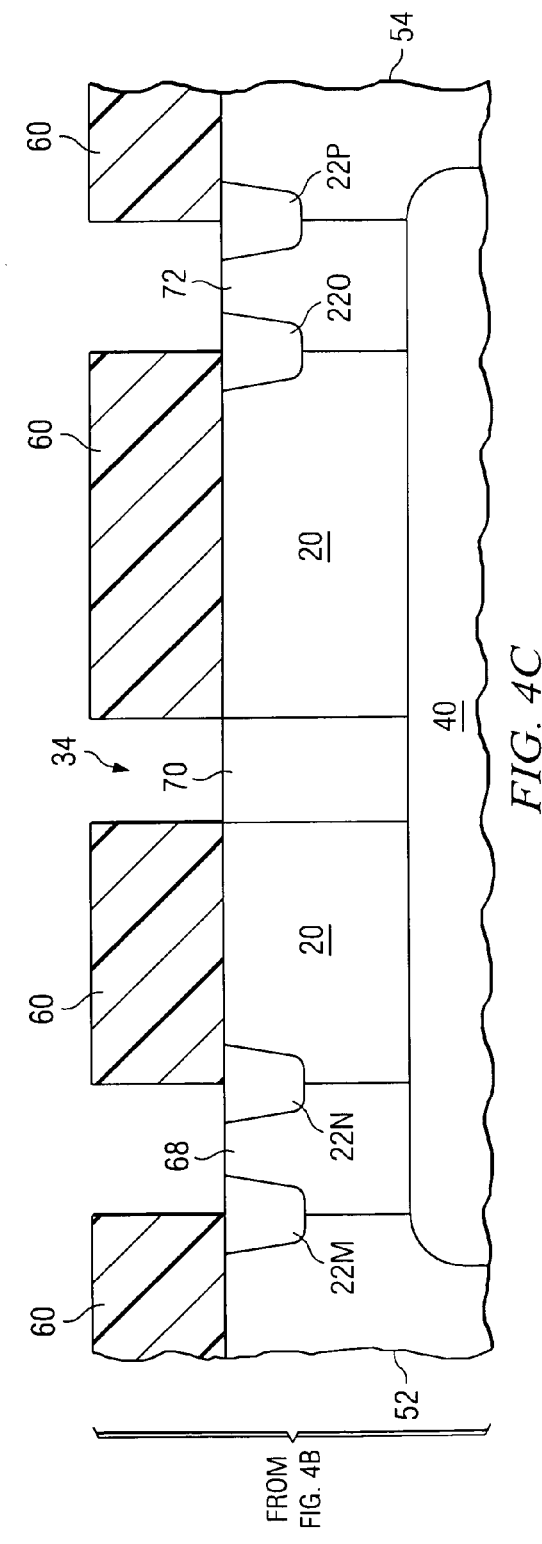

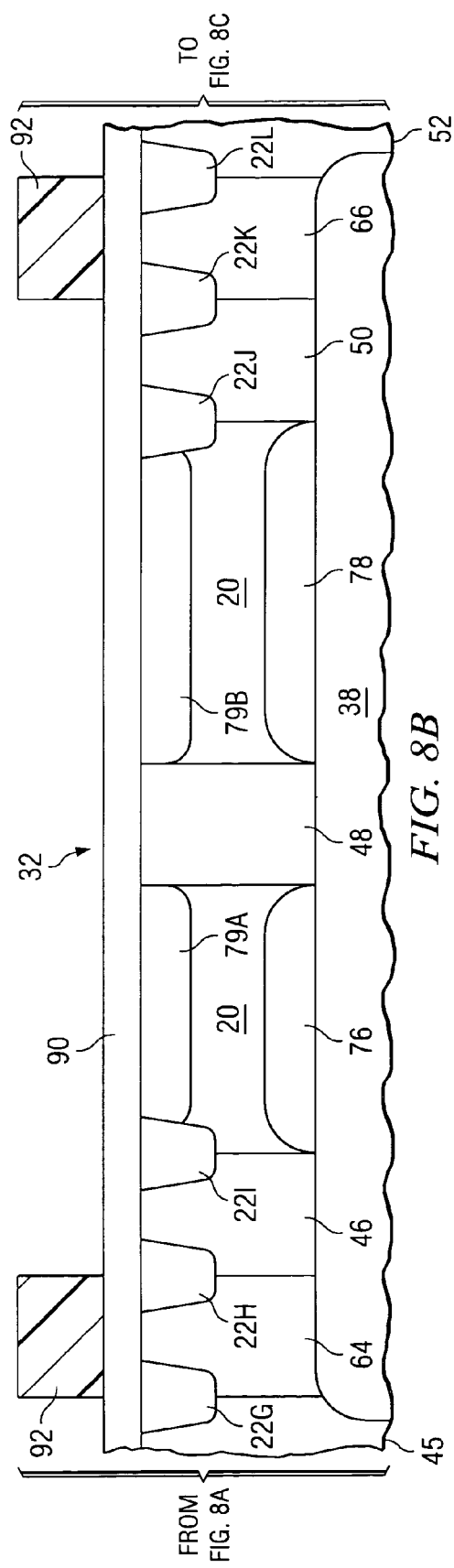
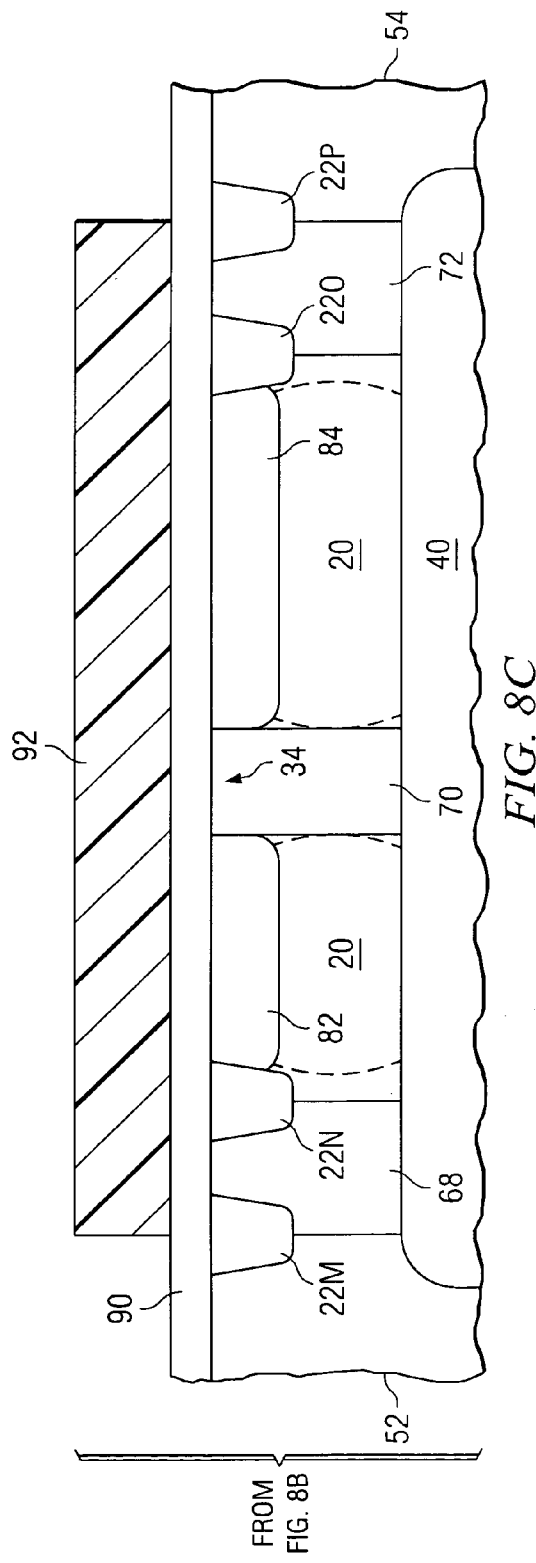

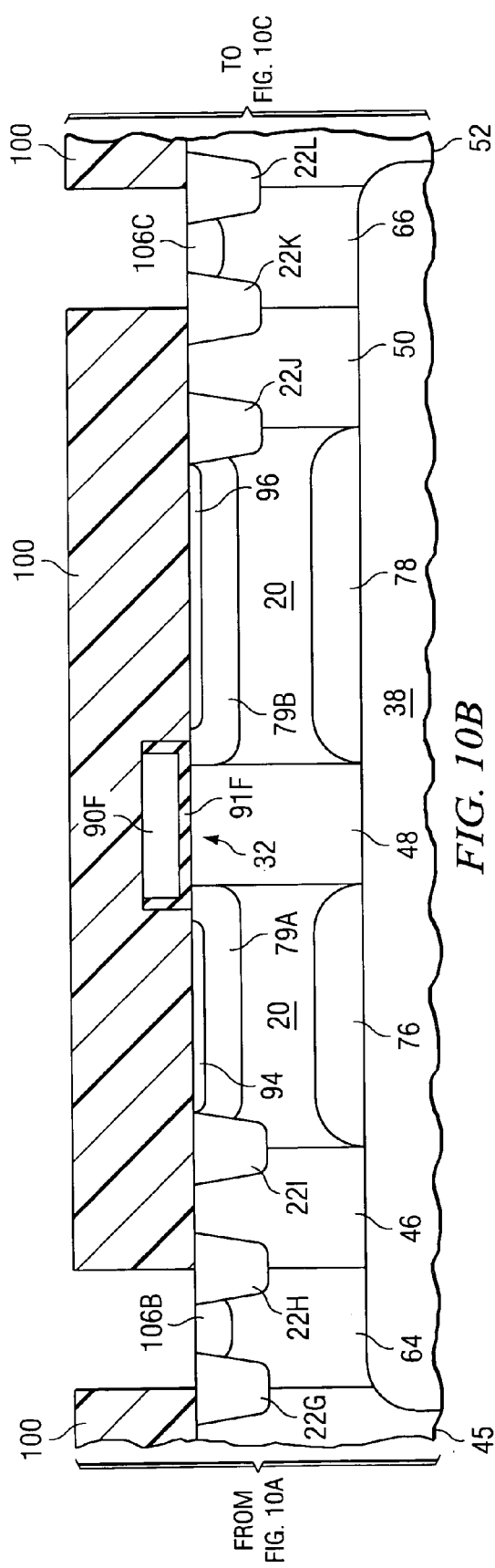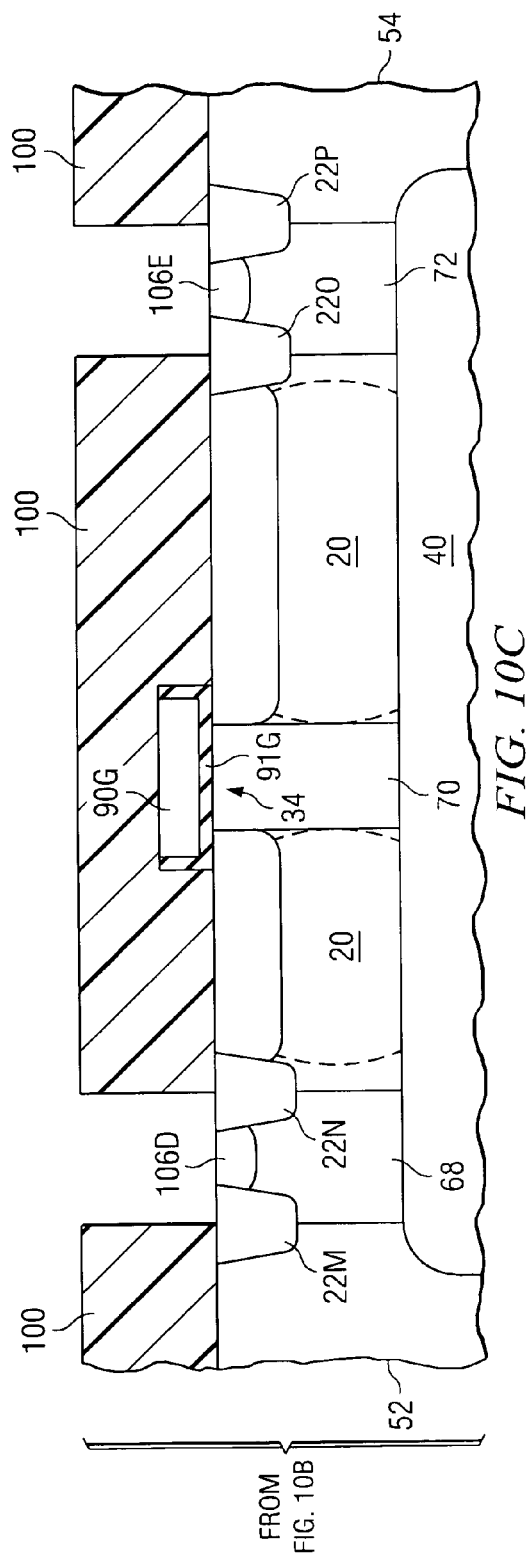

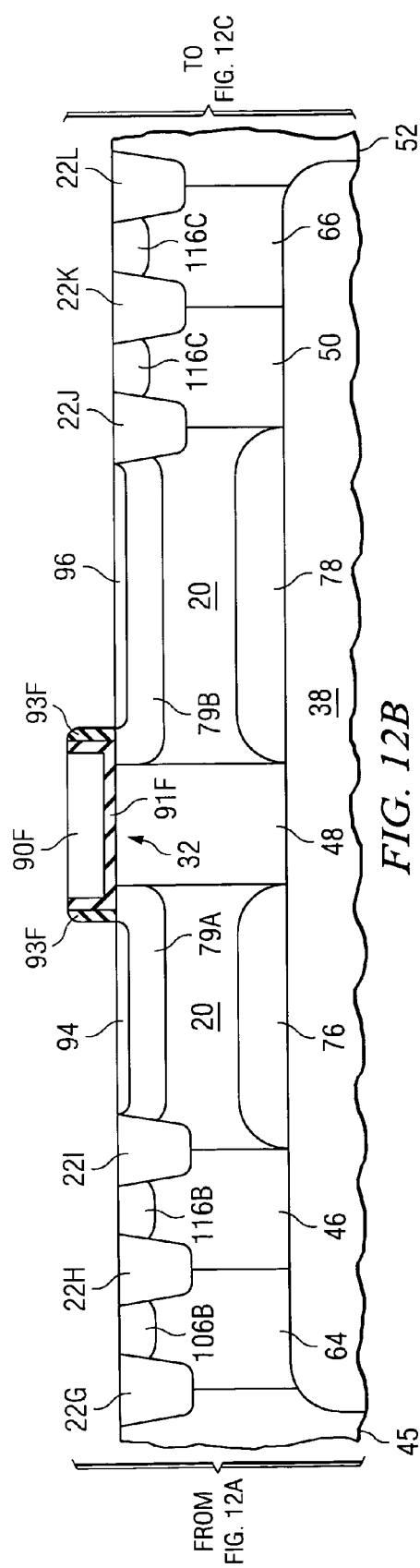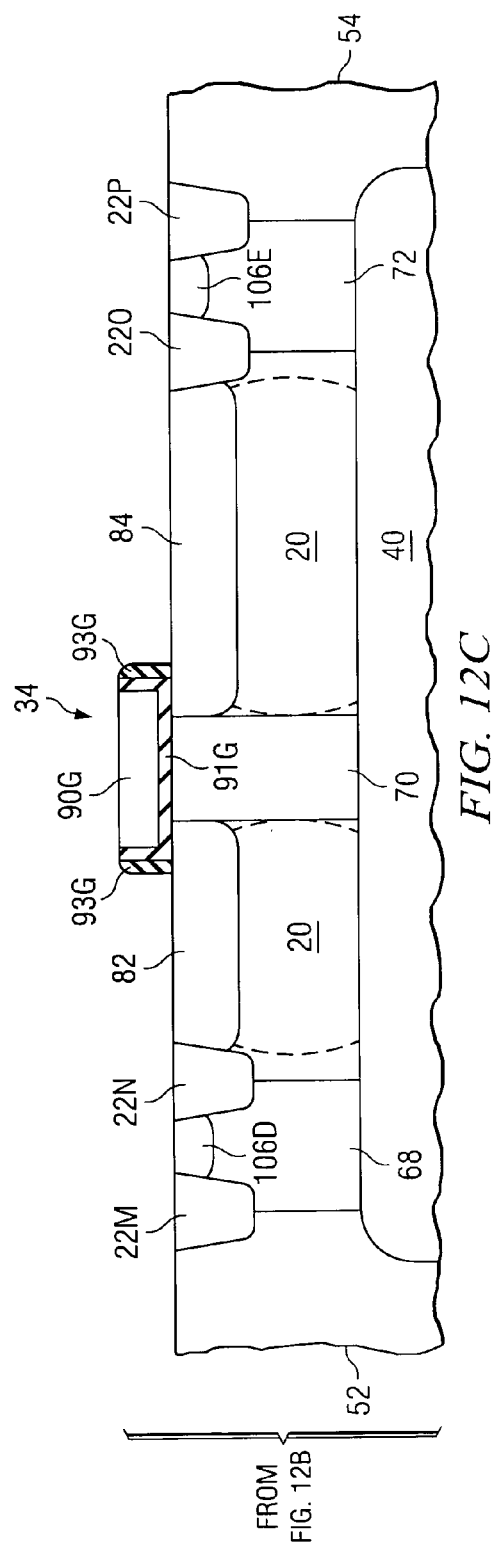

Figure 15C:
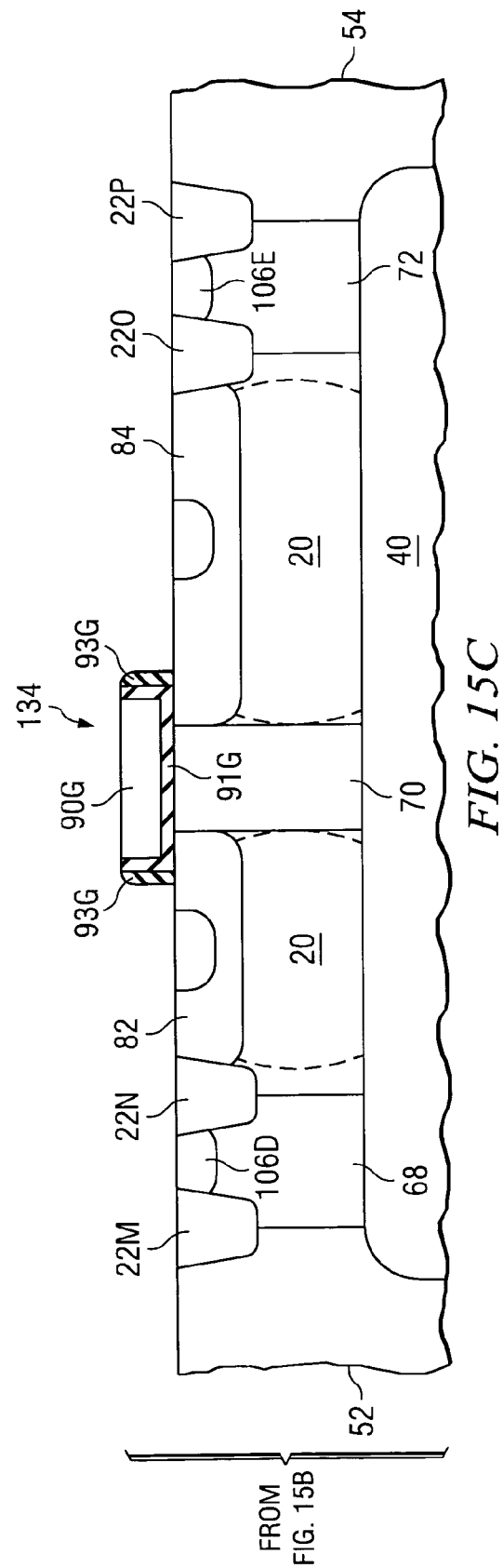

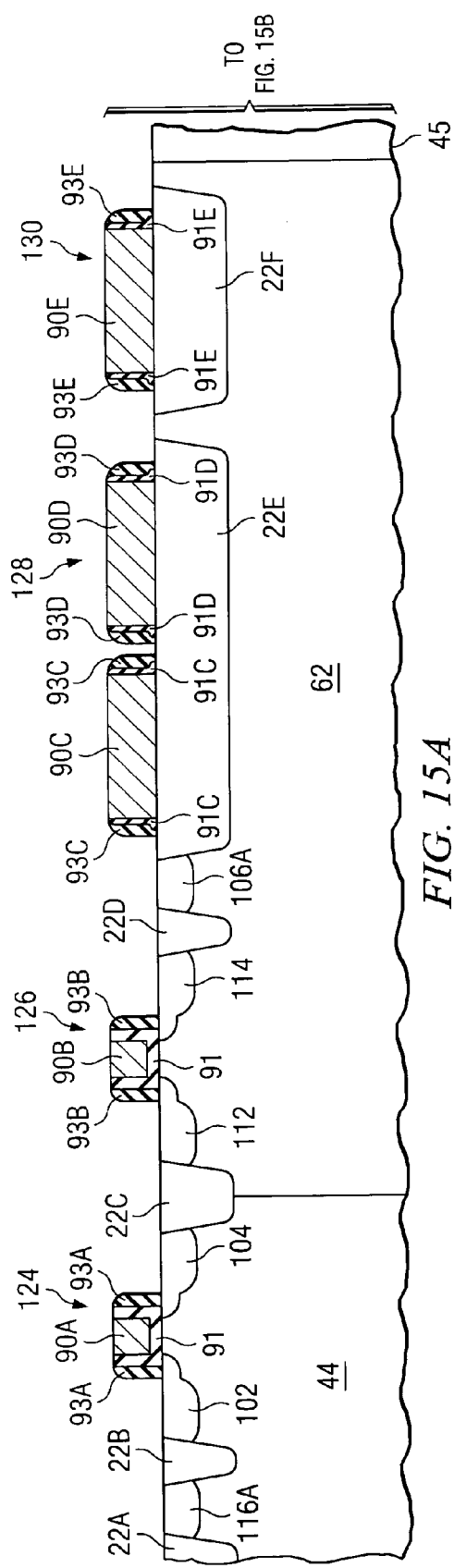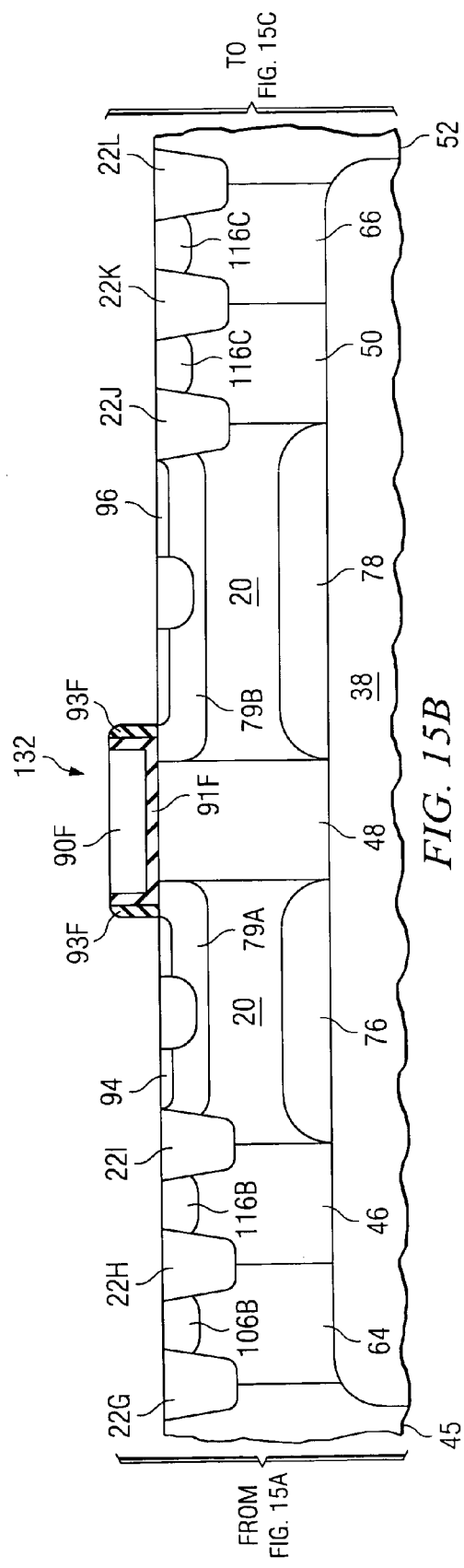
FIG. 15A
FIG. 15B

METHOD AND STRUCTURE FOR A LOW VOLTAGE CMOS INTEGRATED CIRCUIT INCORPORATING HIGHER-VOLTAGE DEVICES

This is a division of application Ser. No. 10/909,634, flied Aug. 2, 2004 now U.S. Pat. No. 6,969,901, the entire disclosure of which is hereby incorporated by reference.

FIELD OF THE INVENTION

The present invention relates generally to the formation of integrated circuit devices and more particularly to methods and structures providing both low-voltage and relatively high-voltage CMOS devices on a single integrated circuit chip.

BACKGROUND OF THE INVENTION

Bipolar transistors constitute a well-known type of active transistor device wherein the device emitter, base and collector regions comprise appropriately doped semiconductor regions having direct physical contact in a base-emitter-collector configuration. The base, emitter and collector regions are appropriately biased with electronic voltages, and a voltage or current applied to the base in order to control the switching of the device. Bipolar devices provide many beneficial operating characteristics including high switching speed and high power handling capability. Bipolar transistors were for many years incorporated onto integrated circuits and used in a multitude of electronic devices from computers to consumer electronics. Bipolar transistors, however, suffer the disadvantage of requiring a relatively high operating power.

Metal oxide semiconductor transistors, and more particularly complementary MOS (CMOS) transistors, represent a relatively more recent transistor design wherein semiconductor drain and source regions are spaced by a semiconductor gate region, a voltage or current being applied to the gate to control the switching of the transistor. CMOS devices exhibit the desirable characteristic of requiring relatively low operating power in comparison to bipolar devices. Recent generations of CMOS devices have overcome various disadvantages including relatively large device size and relatively slow switching speeds in comparison to bipolar devices. However, CMOS devices are still relatively limited in their power-handling capabilities in comparison to bipolar devices.

Many electronic circuit applications require integrated circuits having both the ability to witch higher amounts of power and still operate using relatively lower power consumption. Such applications include mobile telephone electronics, automobile control electronics and multitudes of others know to the reader.

One form of integrated circuit, a bipolar-CMOS, or BiCMOS circuit, incorporates both bipolar and CMOS devices onto a single integrated circuit. See, for example, U.S. Pat. Nos. 5,256,582 and 5,181,095, both to Mosher et al., show a method of forming higher-power bipolar and lower-power MOS transistors on the same integrated circuit chip or substrate. With both bipolar and MOS devices incorporated onto a single integrated circuit, the bipolar transistors are used for higher-power switching and control applications while the MOS transistors are used for the lower-power logic applications.

One significant disadvantage of BiCMOS integrated circuits is that the processes of forming bipolar and CMOS devices are significantly different, requiring complex fabrication processes to form both types of devices on a single integrated circuit.

More recently attempts have been made to manufacture integrated circuits with CMOS devices having at least some portion thereof suitable for higher-power switching and control operations while the balance of the devices are suitable for high-speed, low-power logic applications. See, for example, U.S. Pat. No. 5,296,393 to Smayling et al. showing an insulated circuit including both complimentary CMOS logic devices and relatively higher-power insulated gate field-effect transistors (IGFETs). In some instances, however, IGFETs exhibit less than desirable operating characteristics, such as RDSon×Area.

The industry has recognized and the present inventors have similarly determined that it would be desirable to provide integrated circuits containing both CMOS devices operable as low-voltage logic devices and CMOS devices operable as relatively high-voltage switching and control devices. It would be further desirable if such processes and structures did not require complex variations to and deviations from ordinary CMOS manufacturing processes.

SUMMARY OF THE INVENTION

There are provided herein methods for fabricating, and subsequent structures of, integrated circuits including, both on the same chip, CMOS devices suitable for low-power, high-speed logic applications and CMOS devices suitable for relatively higher-power switching and control applications. An advantage of the invention is that these high and low power devices are formed on the same integrated circuit using processes generally compatible with and including only minor variations over conventional CMOS manufacturing processes.

In one embodiment of the invention there is provided an integrated circuit chip containing at least one relatively low-voltage NMOS transistor and at least one relatively high voltage NMOS transistor, comprising: a silicon substrate; a first P-well in the silicon substrate; a low-voltage NMOS transistor in the first P-well including source and drain regions in the surface of the silicon substrate spaced by a gate region; a second P-well in the silicon substrate; a first buried N-well in the bottom of the second P-well; first and second buried P-layers in the second P-well on the upper surface of the buried N-well; and a high-voltage NMOS transistor in the second P-well including source and drain regions in the surface of the silicon substrate, the source and drain regions each spaced from the first and second P-layers and spaced from one-another by a gate region.

In another embodiment of the invention there is provided a method of forming an integrated circuit chip containing at least one relatively low-voltage NMOS transistor and at least one relatively high voltage NMOS transistor, comprising: providing a silicon substrate having a first P-well and a second P-well; forming a low-voltage NMOS transistor in the first P-well including source and drain regions in the surface of the silicon substrate spaced by a gate region; forming a first buried N-well in the bottom of the second P-well; forming first and second buried P-layers in the second P-well on the upper surface of the buried N-well; and forming a high-voltage NMOS transistor in the second P-well including source and drain regions in the surface of the silicon substrate, the source and drain regions each spaced from the first and second P-layers and spaced from one-another by a gate region.

OVERVIEW OF THE DRAWING FIGURES

These and other objects, features and advantages of the invention will be apparent from the following detailed description of the invention when read in conjunction with the drawing Figures.

FIGS. 1–15 are cross-sectional views showing consecutive steps in the formation of an integrated circuit in accordance with the present invention. Each Figure comprises three views, labeled A, B and C, representing adjoining sections of the same integrated circuit chip.

DETAILED DESCRIPTION OF THE INVENTION

Figure 1A:
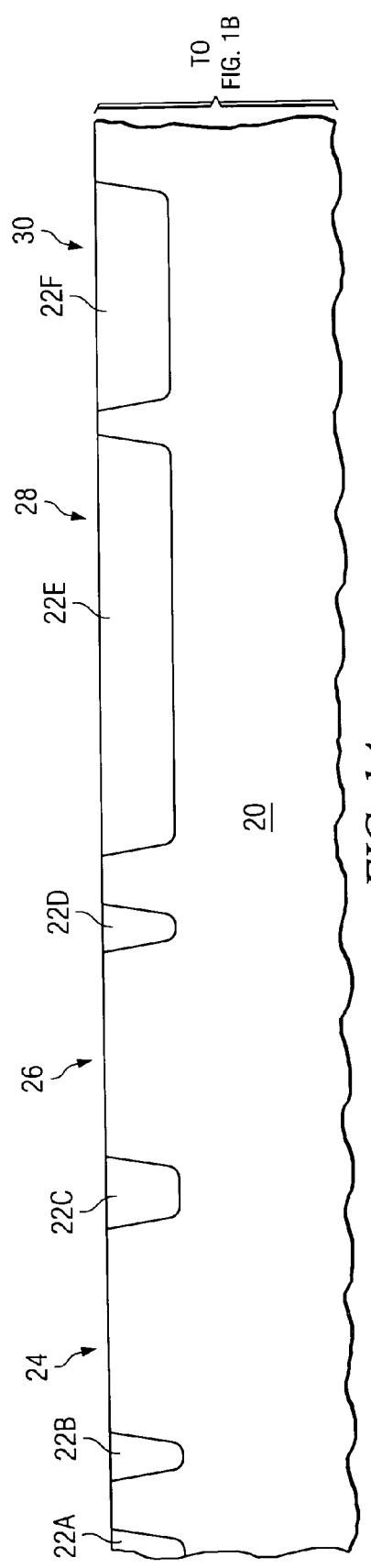
Figure 1B:
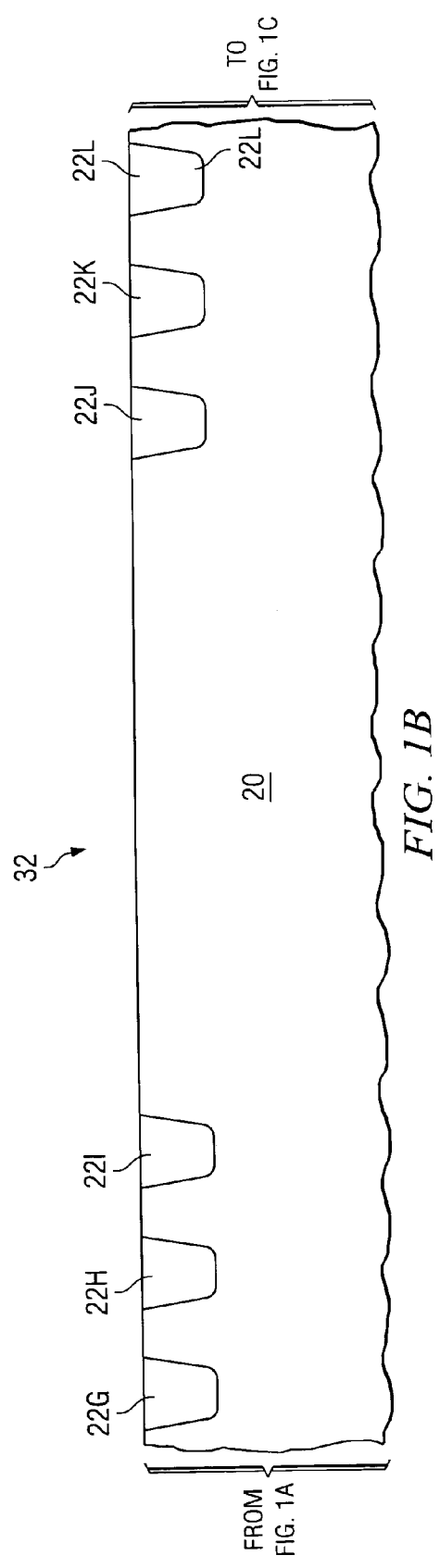
Figure 1C:
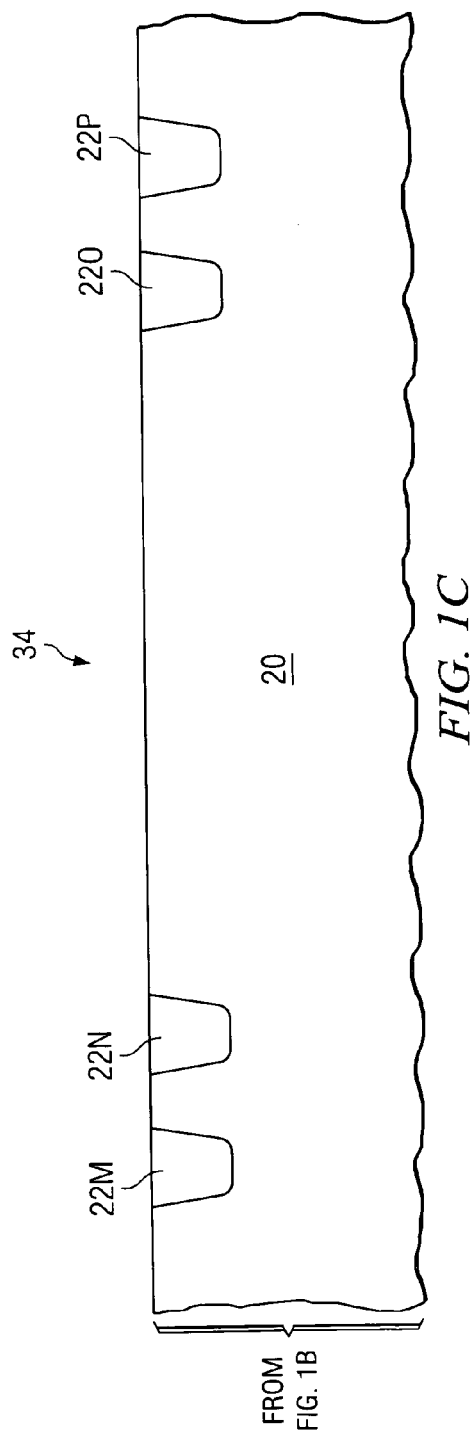

With reference now to FIG. 1, an integrated circuit structure is seen to comprise a p-doped epitaxial silicon substrate 20, the substrate doped with a P-type dopant such as Boron or $BF_2$ to a resistivity in the range of 1.6–2.2 Ohm-centimeters. A series of conventional isolation trenches, indicated at 22A–22P are shown formed in the upper surface of substrate 20, in a conventional manner, for example as oxide-filled trenches, to electronically delineate regions of the substrate in which various active and passive devices are to be formed. As used herein, references to "XeY" indicate conventional concentrations of "X times 10-to-the-Y power." Where appropriate, descriptors such as "low," "mid" and/or "high" are used to denote numerical ranges.

As will be seen from the detailed description below, upon completion of the inventive process, substrate regions 24 and 26 will support low-voltage N— and P-MOS devices, respectively. Region 28 will support a capacitor and region 30 a resistor. Regions 32 and 34 will support relatively high-voltage N— and P-MOS devices, respectively. More specifically, the low-voltage devices herein will be formed to operate at conventional 1.5V logic levels, while the higher-voltage devices will switch up to 20 volts.

Figure 2A:
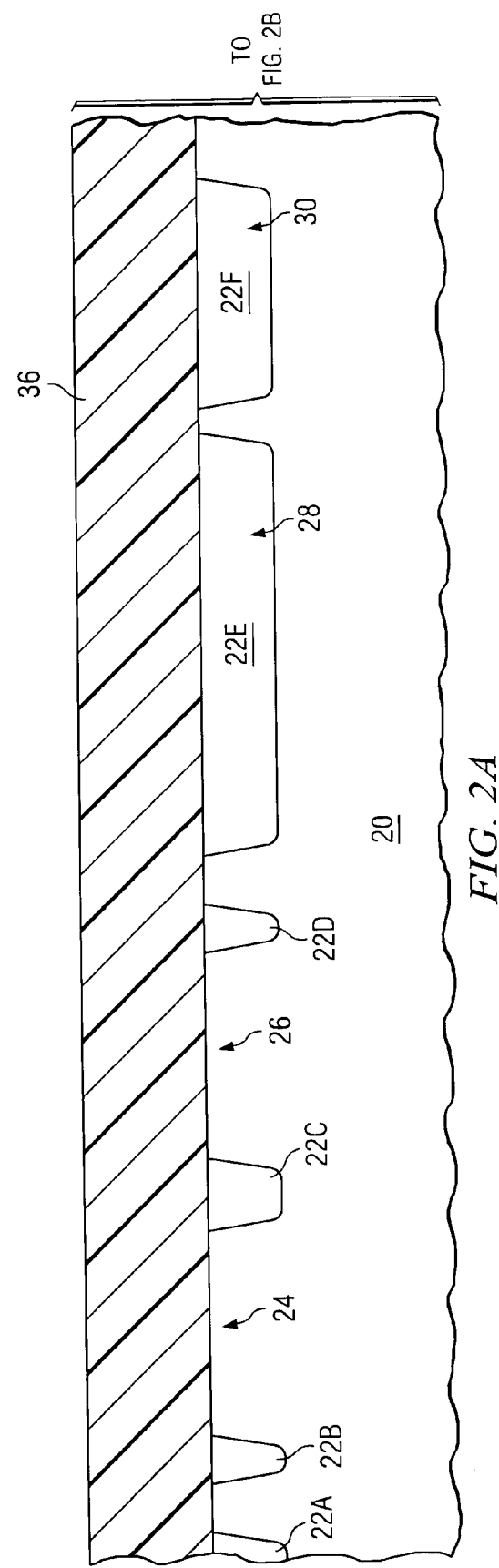
Figure 2B:
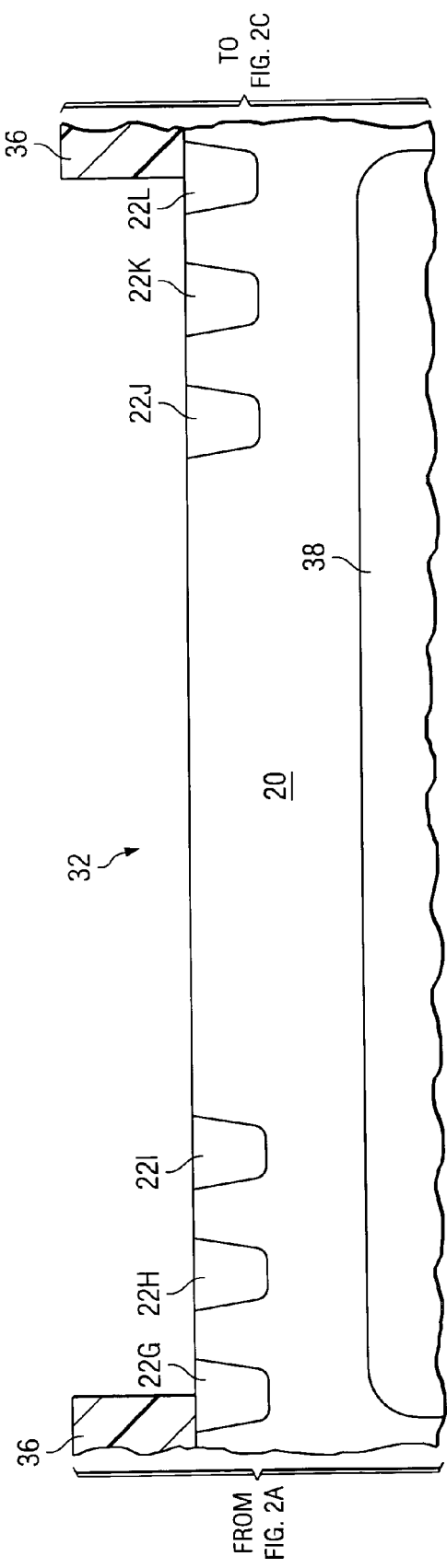
Figure 2C:
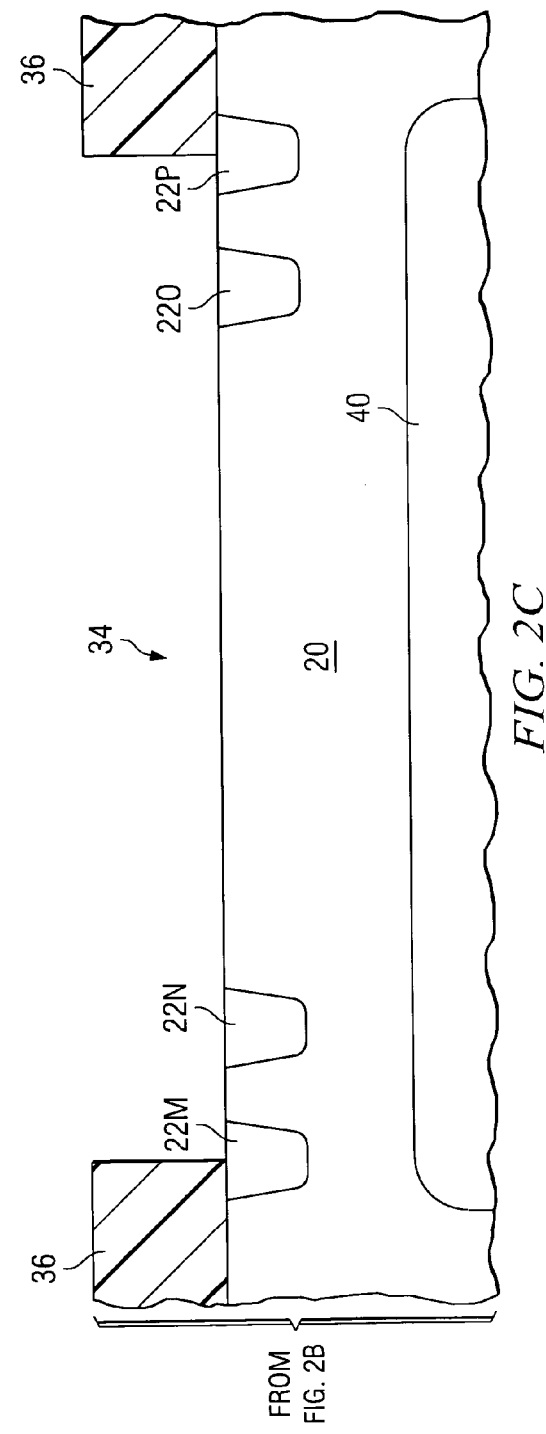

With reference now to FIG. 2, a layer 36 of masking material, for example an oxide, nitride or photoresist, is deposited conformally over the surface of devices, 24, 26, 28 and 30 in FIG. 2B, leaving the upper surfaces of device regions 32 and 34 exposed. An implantation of N-type dopant is performed, for example using an ion implantation of arsenic or phosphorous at a concentration of 1–2e13 and 1200–1500 Kev, to form buried N regions 38 and 40.

As used herein, a capitalized "N" or "P" to denote a region, well, layer or other area in substrate 20, for example 'N-well', 'P-region'or 'P-layer', indicates the dopant type of that area.

Figure 3A:
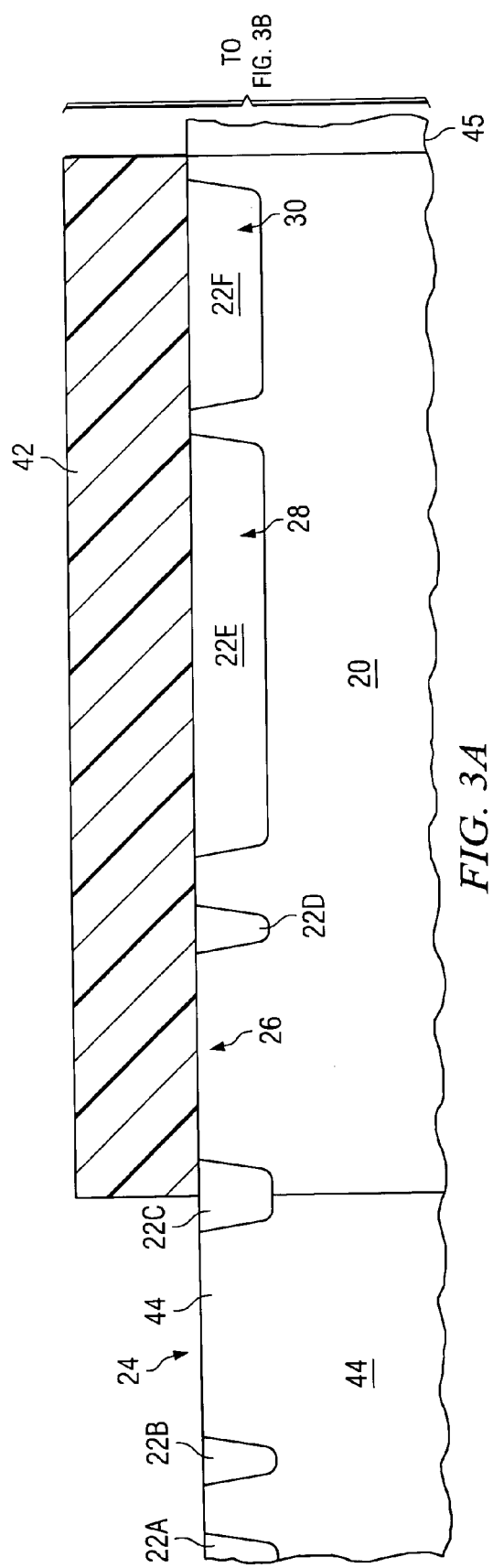
Figure 3B:
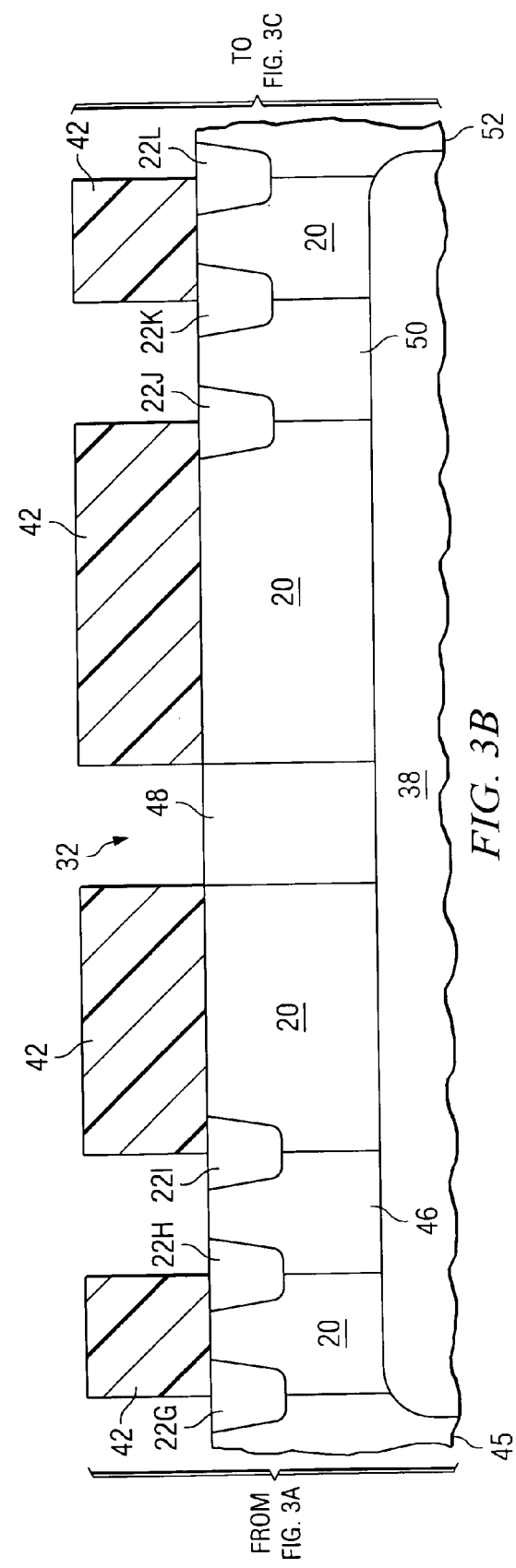
Figure 3C:
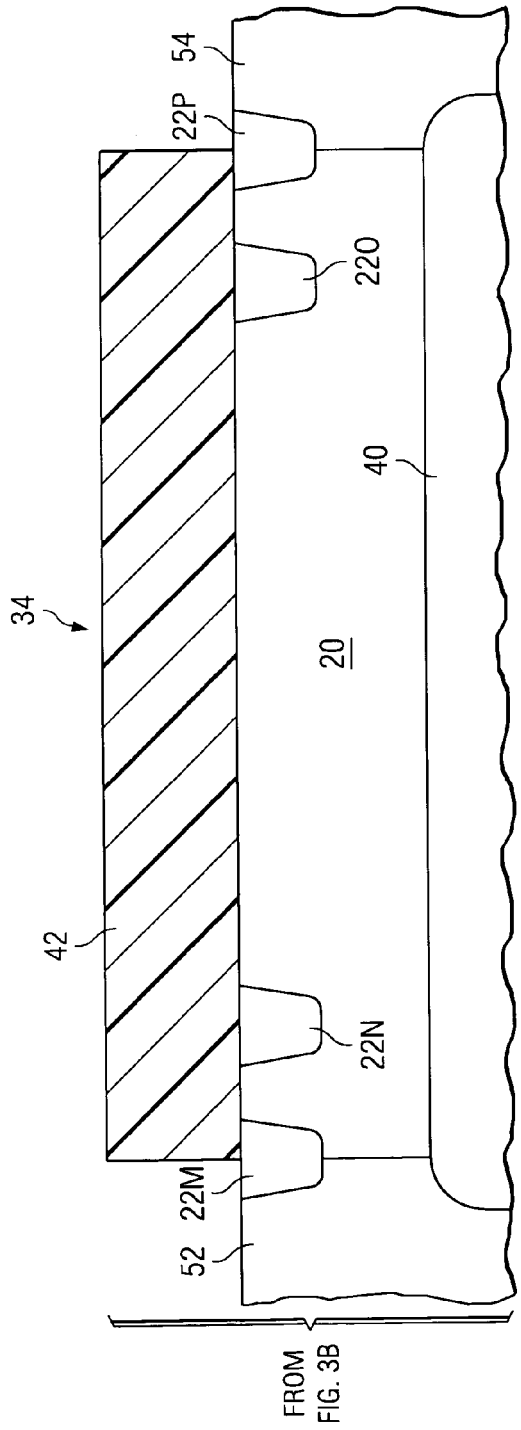

With reference now to FIG. 3, layer 36 has been stripped, for example by a suitable plasma ash or chemical clean process, and a layer 42 of masking material, for example photoresist, is deposited conformally over the surfaces of device regions 26, 28, 30 and 34 as well as portions of device region 32. An implantation of P-type dopant such as B11 is then performed, for example as a series of multiple implants i) high e12 in the range of 10–20 Kev, ii) high e12 in the range of 100–130 Kev and iii) low e13 in the range of 275–325 Kev. There are thus formed the following P-well regions: i) P-well 44 in device region 24, ii) P-wells 45, 46, 50 and 51 surrounding device region 32, iii) P-well 48 within the generally central region of device region 32, and iv) P-wells 52, 54 surrounding device region 34.

Figure 4A:
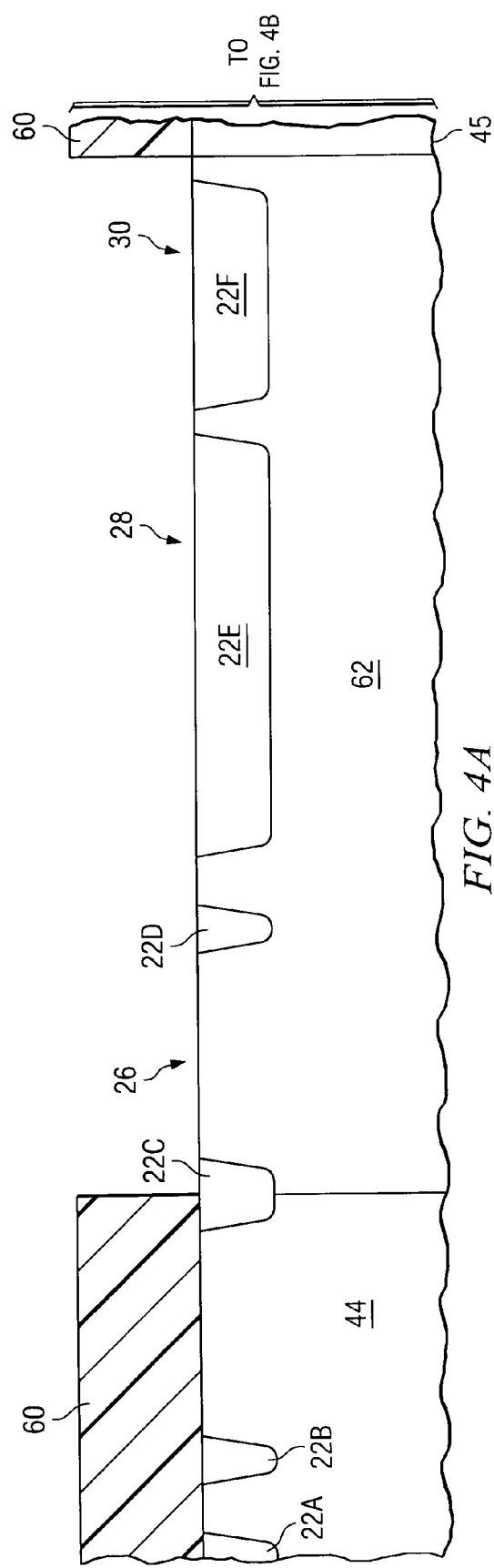

With reference now to FIG. 4, layer 42 is removed, for example by a suitable plasma ash or chemical clean process and another masking layer 60 of photoresist is formed over the upper surfaces of device regions 24, 32 and portions of device region 42. An ion implantation is then performed implanting N-type dopant, for example in a four-step process such as: i) As in the range of mid e12 and 10–20 Kev, ii) As in the range of low e12 and 150–200 Kev, iii) P31 in the range of mid e12 at 250–275 Kev, and iv) P31 in the range of mid e13 and 450–550 Kev. There are thusly formed N-well regions: i) N-well region 62 in device region 26, ii) N-well regions 64 and 66 surrounding device region 32 as isolation regions, iii) N-well regions 68 and 72 surrounding device region 34, and iv) N-well region 70 within device region 34.

Figure 5A:
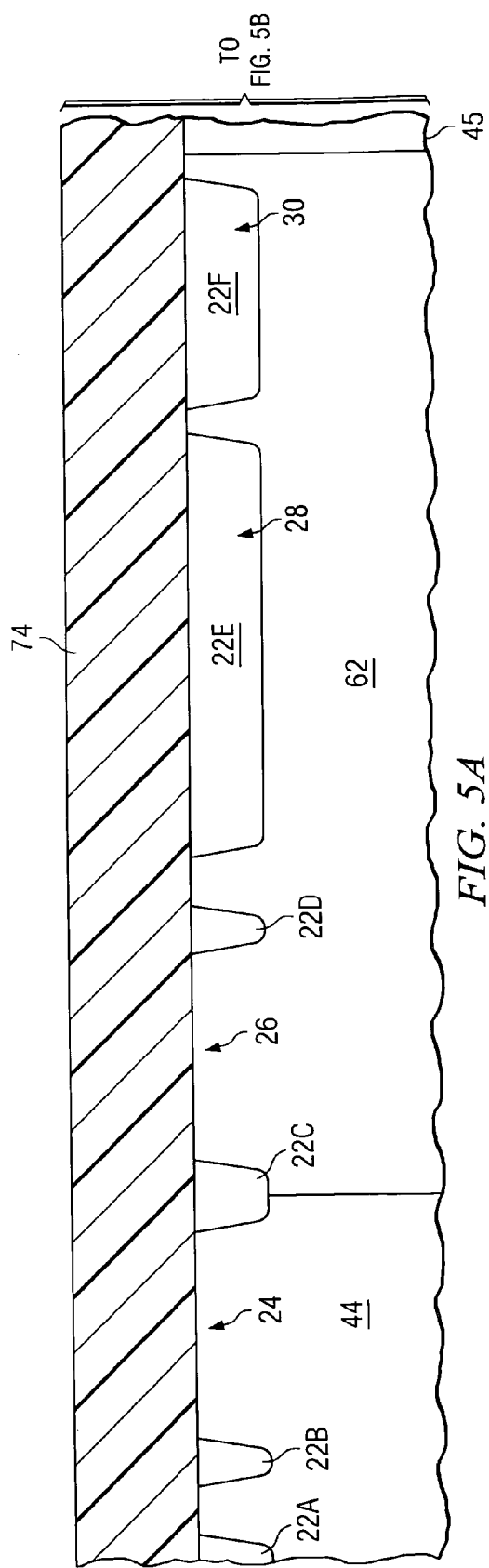
Figure 5B:
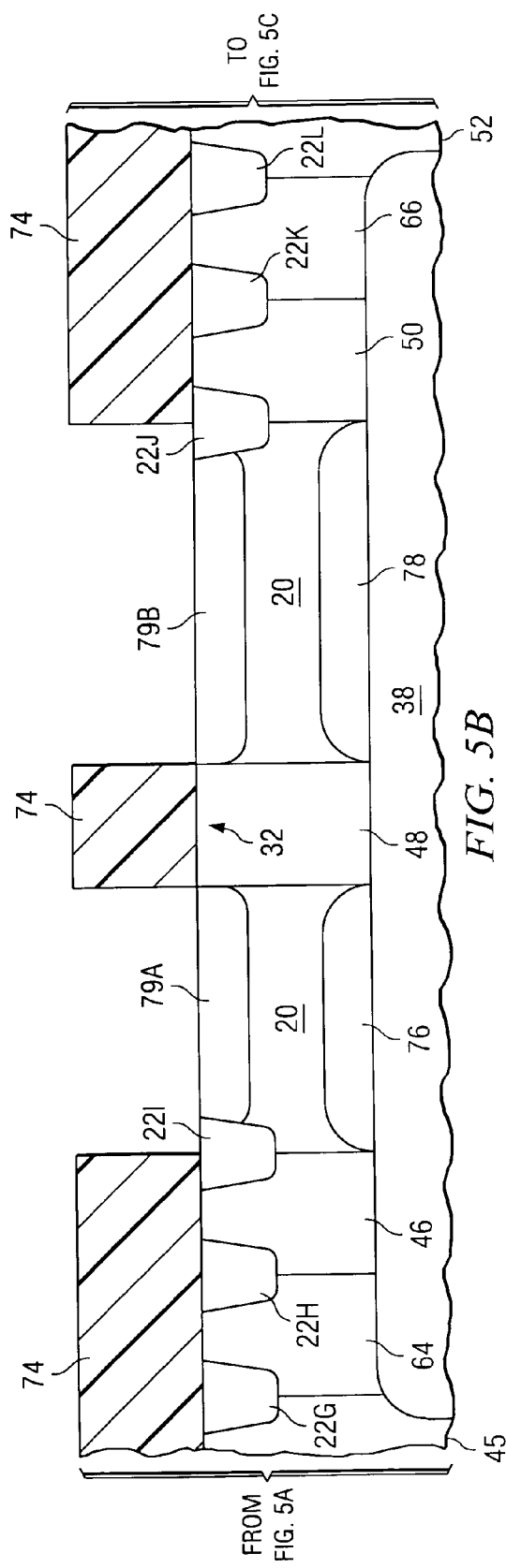
Figure 5C:
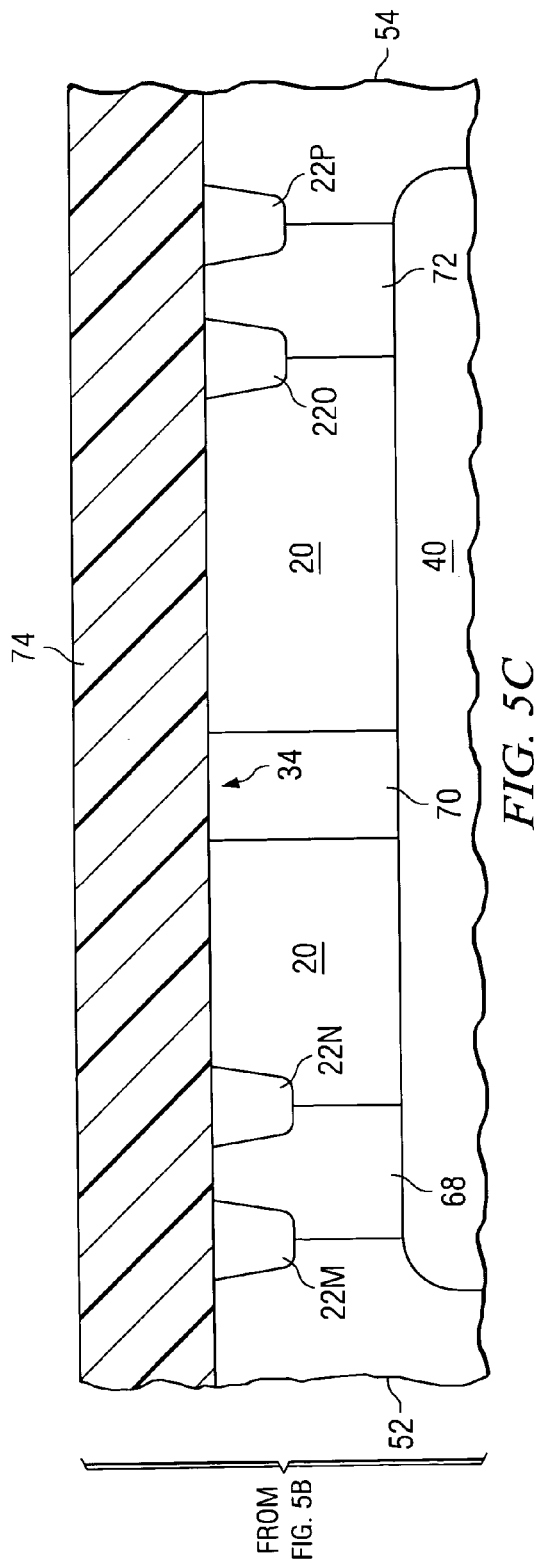

With reference now to FIG. 5, layer 60 is removed and another masking layer 74 of photoresist is formed conformally over the upper surfaces of device regions 24, 26, 28, 30, and 34. The masking layer is similarly formed over the isolation trenches 22G, H, J, I, K & L surrounding device region 32, and centrally over device region 32. Subsequent to the formation of mask 74, a P-type dopant implantation is done at a concentration in the range of low e13 and energy level in the range of 400–500 Kev, thereby forming P-type buried layers 76 and 78. An N-type dopant ion implantation is then performed at a concentration of about mid-e12 and an energy level in the range of 125–175 Kev, thereby forming N-type regions 79A, 79B in the upper surface of device region 32. An advantage of the present invention is that both P-buried layers 76 and 78 as well as N-drain regions 79A, 79B are formed using a single mask, enabling the formation of the P-buried layer with essentially no additional process steps other than the implantation.

Figure 6A:
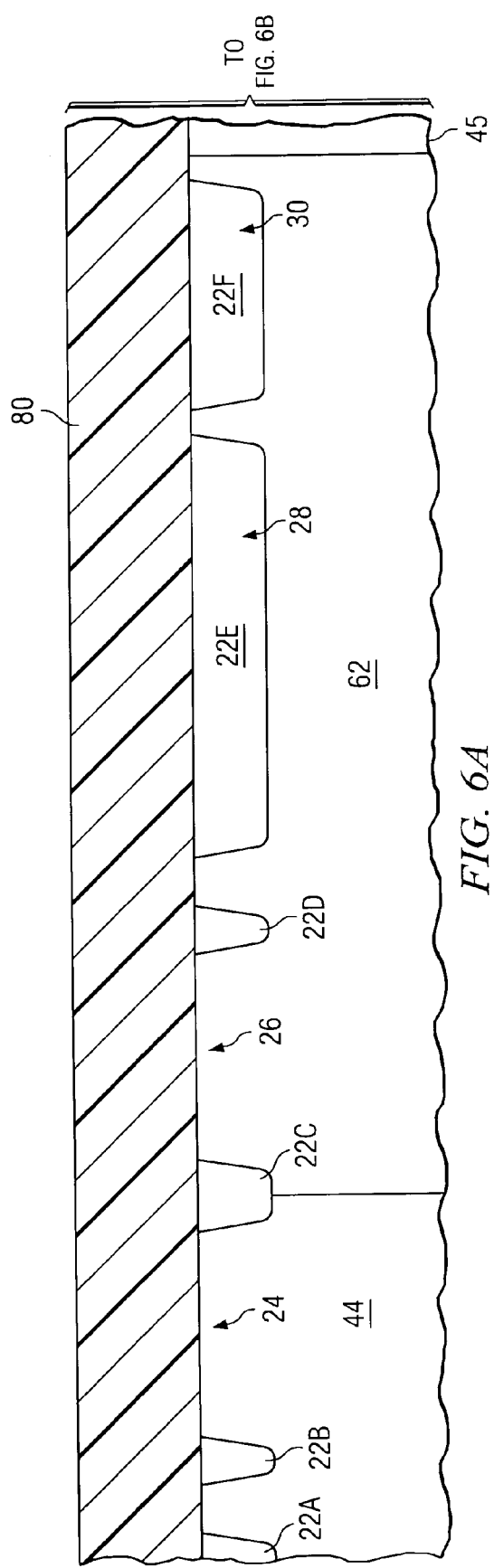
Figure 6B:
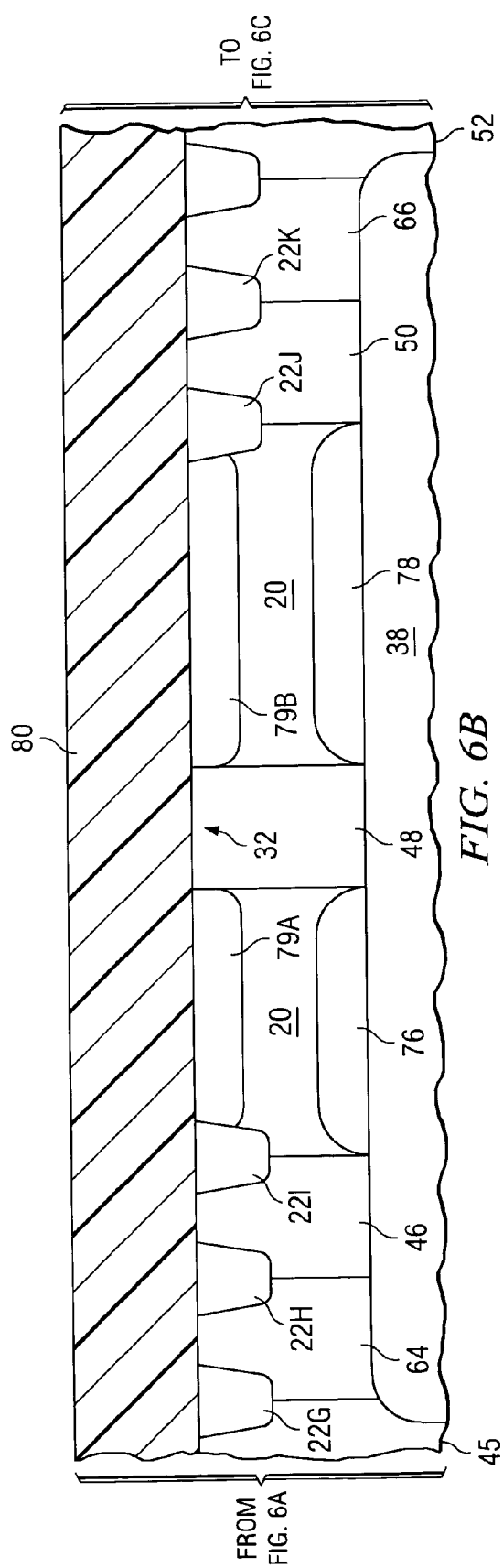
Figure 6C:
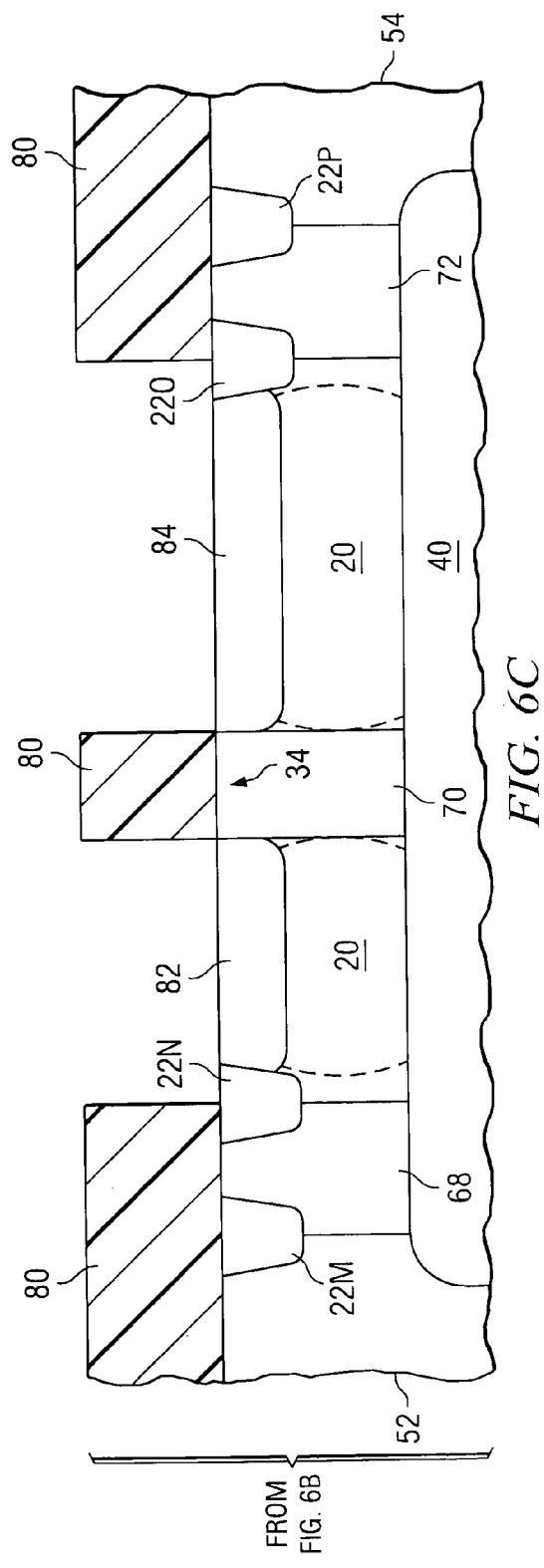

With reference now to FIG. 6, layer 74 is removed and another masking layer 80 of photoresist is formed conformally over the upper surfaces of device regions 24, 26, 28, 30, and 32. The masking layer is similarly formed over the isolation trenches 22M, N, O and P surrounding device region 34, and centrally over device region 34. Subsequent to the formation of mask 74, an P-type dopant ion implantation is performed at a concentration of about mid-e12 and an energy level in the range of 10–50 Kev, thereby forming P-type regions 82, 84 in the upper surface of device region 32 adjoining N well 70

Figure 7A:
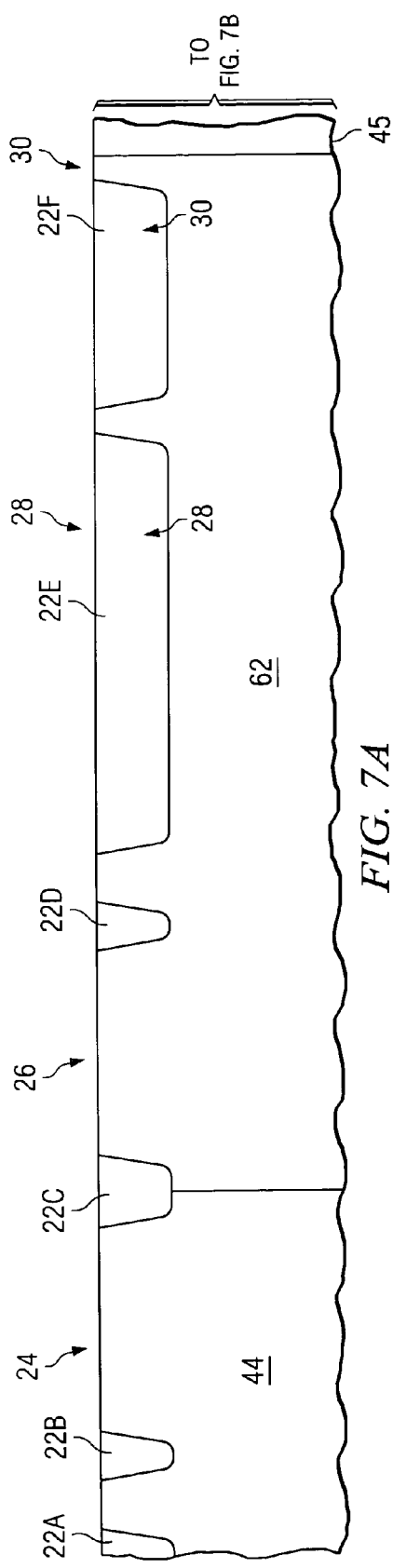
Figure 7B:
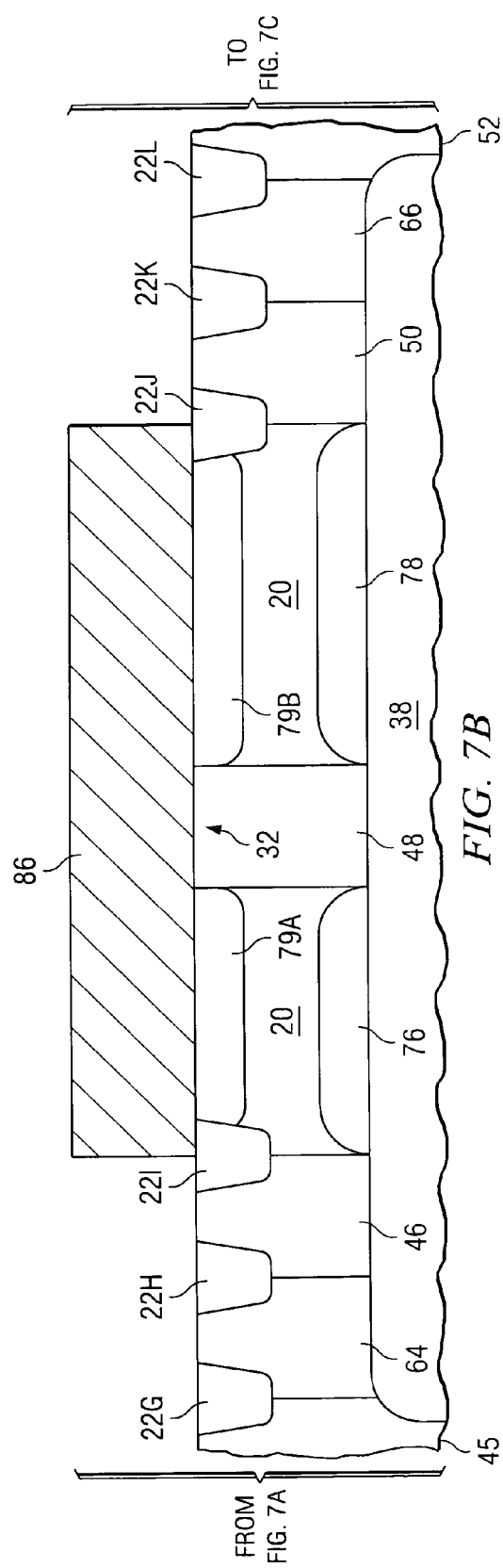
Figure 7C:
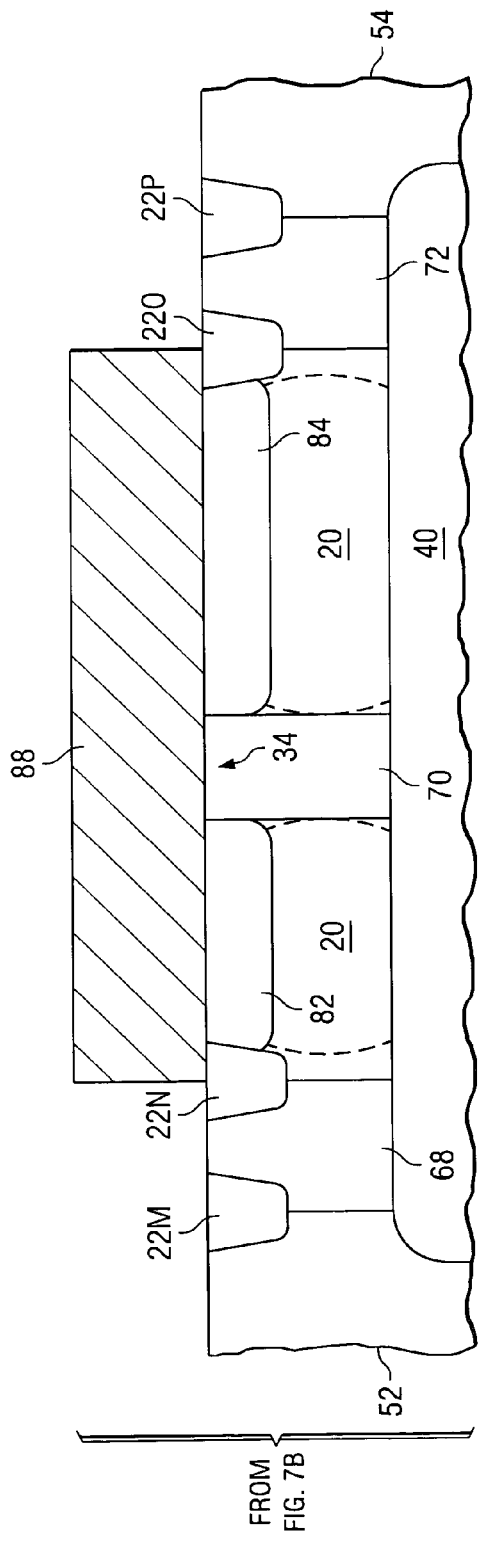

With reference now to FIG. 7, layer 80 is removed. A thin layer of oxide in the range of 60–70 Angstroms is formed conformally over the upper surface of the device. A thick layer 86 of photoresist is formed over the upper surface of device regions 32 and 34. A conventional deglaze process is used to remove all oxide regions not protected by resist layer 86. The resist layer 86 is removed with an ash or chemical clean. A second oxidation is performed to form a layer of oxide in the range of 25–35 Angstroms in thickness on the exposed silicon, thickening the gate oxide over device regions 32 and 34 to in the range of 65–75 Angstroms. These oxide layers are sufficiently thin so as not to be visible in this FIG. 7 but will be enlarged and shown relative to other features described below.

Figure 8A:
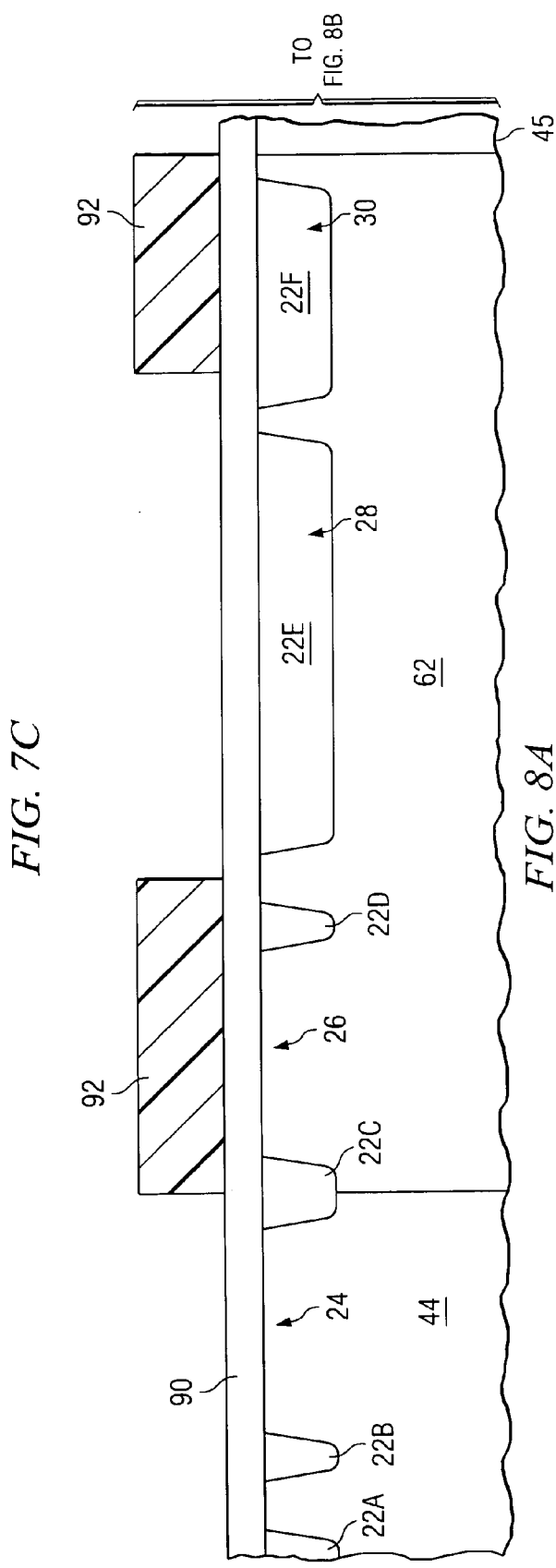

With reference now to FIG. 8, layer 86 is removed and a layer 90 of polysilicon is formed conformally over the upper surface of all device regions on the thin oxide (not visible) overlying substrate 20. Polysilicon layer 90 is formed to a thickness in the range of 1500–2000 Angstroms. Subsequent to the deposition of polysilicon layer 90, a masking layer 92 of photoresist is deposited over the surface of the polysilicon and patterned to leave masking regions over device regions 26, 30 and 34 and over the isolation trenches 22G, H, K and L surrounding device region 32. An ion implantation of N-type doping material is performed at a concentration in the range of mid e15 and a power in the range of 10–20 Kev.

The device is then subjected to a relatively low-temperature, 750–850 degree-centigrade anneal for a time period in the range of 15–25 minutes, whereby to activate the doped regions of polysilicon layer 90.

Figure 9A:
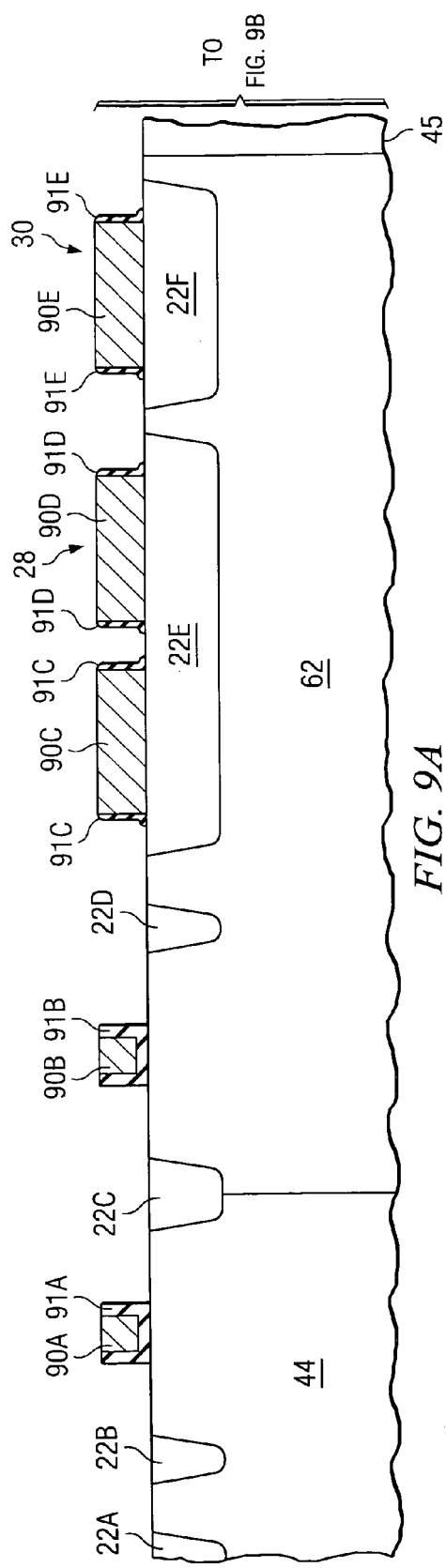
Figure 9B:
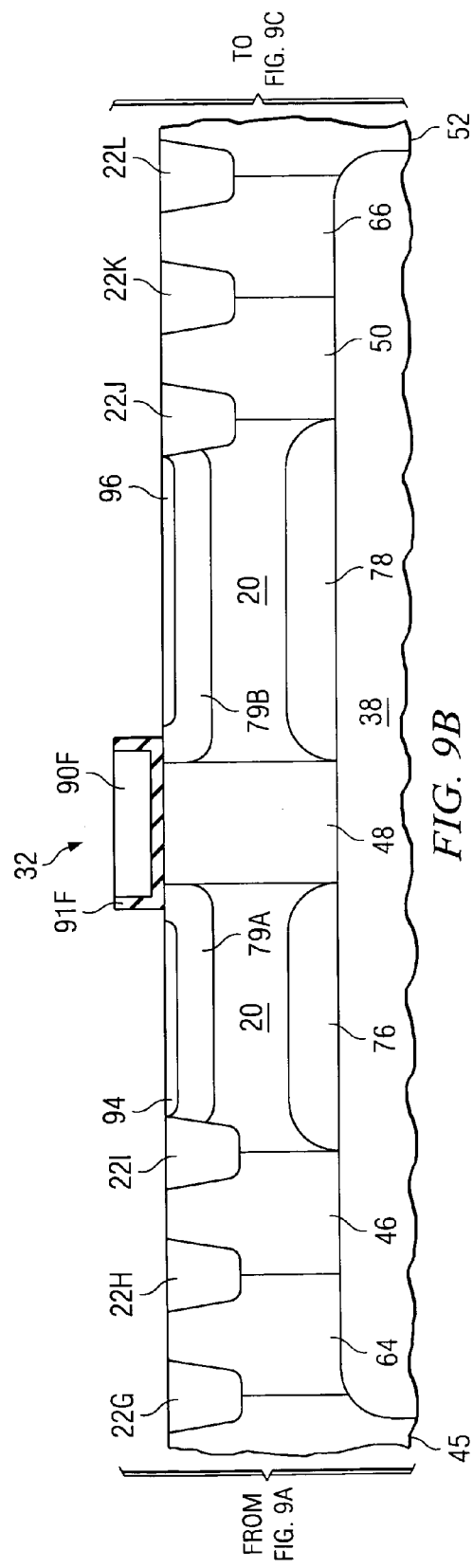
Figure 9C:
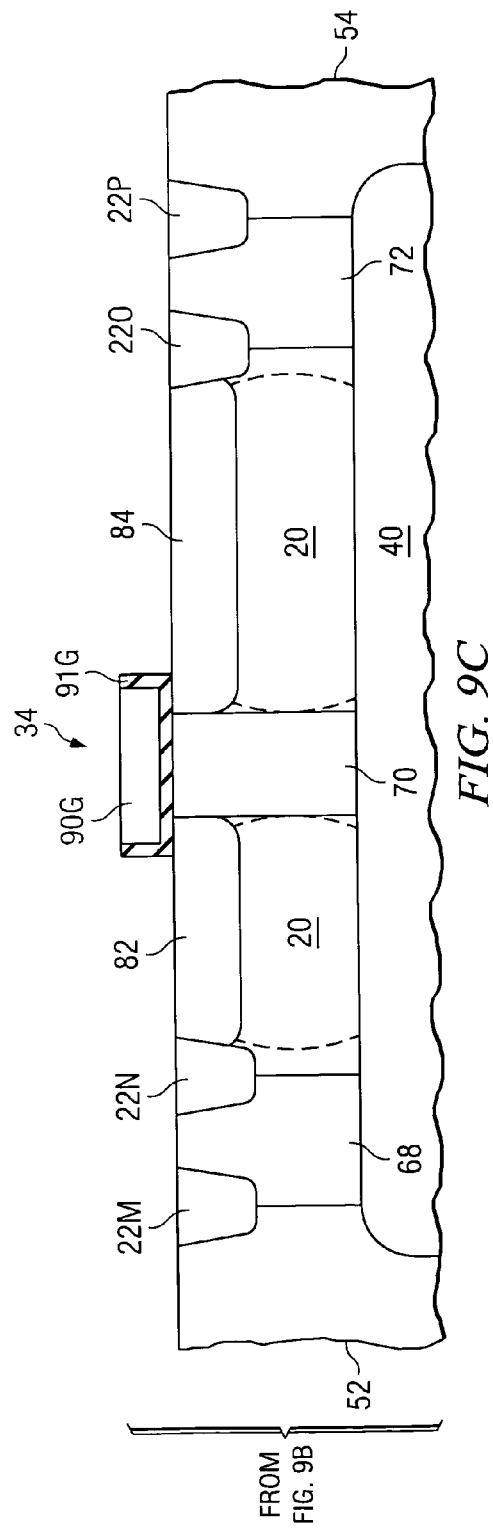

With reference to FIG. 9, masking layer 92 has been removed and the results of the preceding ion implantation are seen to have formed heavily-doped, N-doped regions 90A–G in the polysilicon gates of the n-channel MOS devices and the capacitor bottom plate. Another conventional photoresist mask is formed (not shown) and used to pattern polysilicon layer 90, leaving the following polysilicon gate regions and/or electrical contacts over the corresponding devices: i) gate region 90A over what is to become a low voltage NMOS device in region 24, ii) gate region 90B over what is to become a low voltage PMOS device in region 26, iii) electrical contacts 90C and 90D to what is to become a capacitor in device region 28, iv) electrical contact 90E to what is to become a resistor in device region 30, v) gate region 90F in what is to become a high-power NMOS device in device region 32, and vi) gate region 90G in what is to become a high-power PMOS device in device region 34. A relatively light implant of P dopant, for example at low e12 in the range of 10–40 Kev is performed, forming P floating regions (PFR) 94 and 96 in the upper surface of source and drain regions of device 32.

Continuing with reference to FIG. 9, a polysilicon oxidation process is performed on the structure, at a temperature in the range of 700–900 degrees centigrade in an oxygen environment to form thin regions of oxidation on the side and top surfaces of each of the above-described polysilicon gates. These oxide regions are indicated at 91A–G of corresponding polysilicon regions 90A–G. For purposes of illustration, the above-described thin gate oxide (see FIG. 7 and the corresponding description above) is shown enlarged underneath of the polysilicon regions. The upper surface of the overlying oxide layer is removed with a conventional anisotropic plasma etch to leave the device shown in FIG. 9 with the gates having the oxidized side and lower surfaces.

Figure 10A:
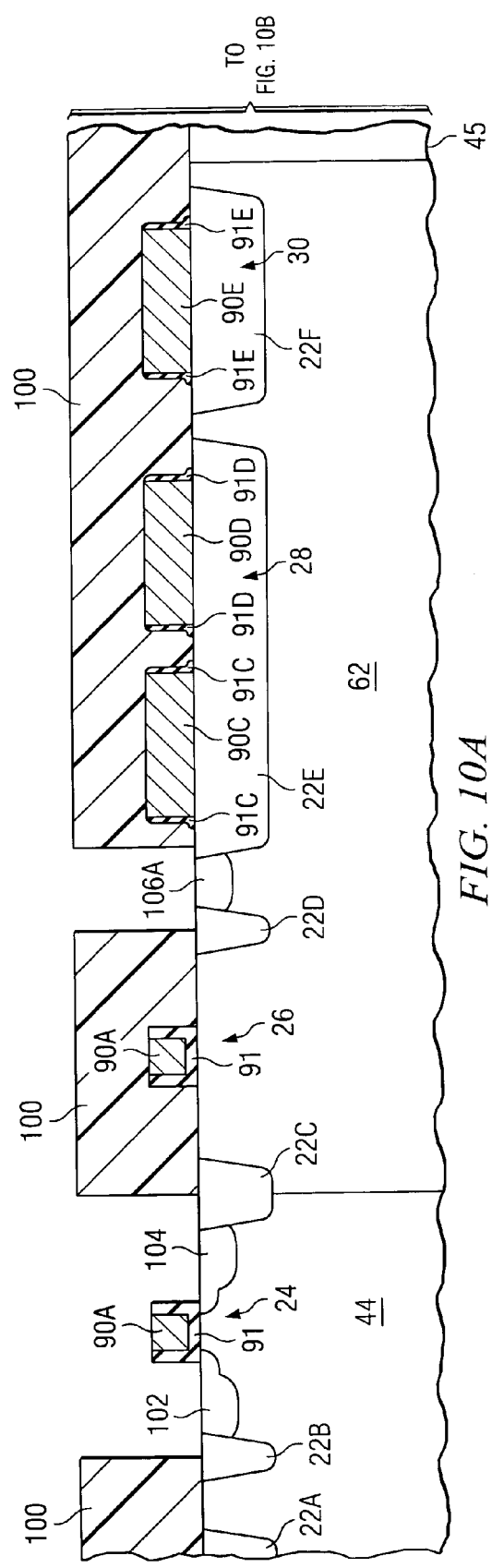

With reference now to FIG. 10, another photoresist mask 100 is formed over the upper surface of the structure and patterned to expose: i) device region 24, ii) the space between isolation trenches 22D and E, iii) the space between isolation trenches 22G and H, iv) the space between isolation trenches 22K and L, v) the space between isolation trenches 22M and N, and vi) the space between isolation trenches 22O and P. Subsequent to patterning the photoresist, a first lightly-doped drain ion implantation of N-type dopant is performed at a dopant level in the range of high e13 and power in the range of 5–15 Kev. Next, a second ion implantation of N-type dopant is performed at a dopant level in the range of mid e13 and power in the range of 10–25 Kev. There are thus formed source and drain regions 102, 104, respectively, in device region 24 and N-type isolation pockets 106A–E between isolation trench pairs 22D–E, G–H, K–L, M–N and O–P, respectively.

Figure 11A:
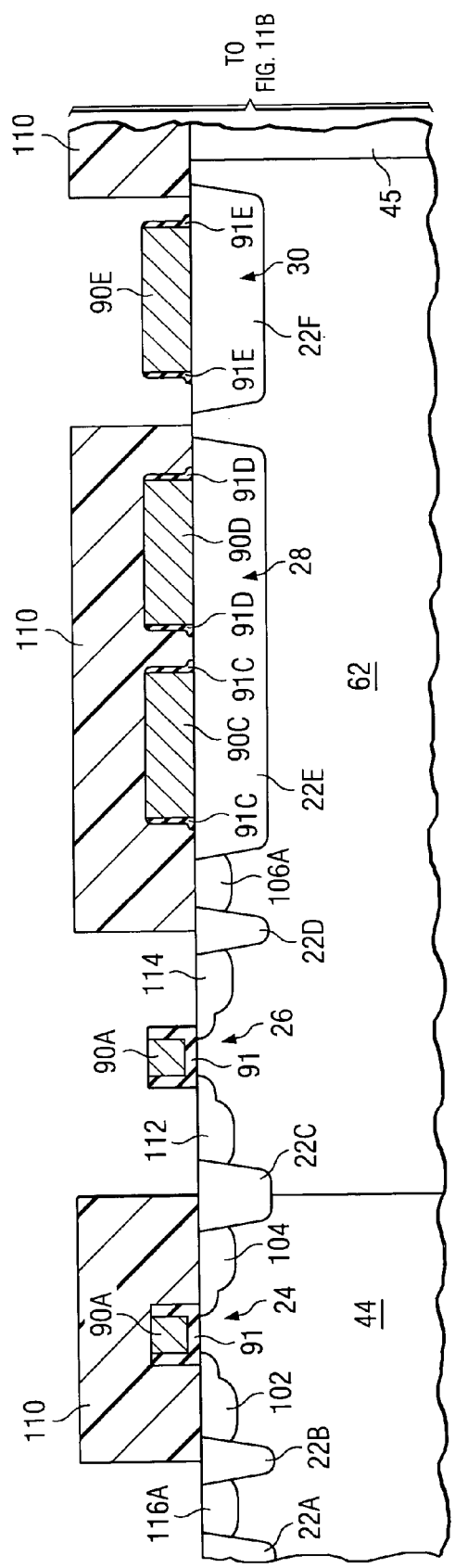
Figure 11B:
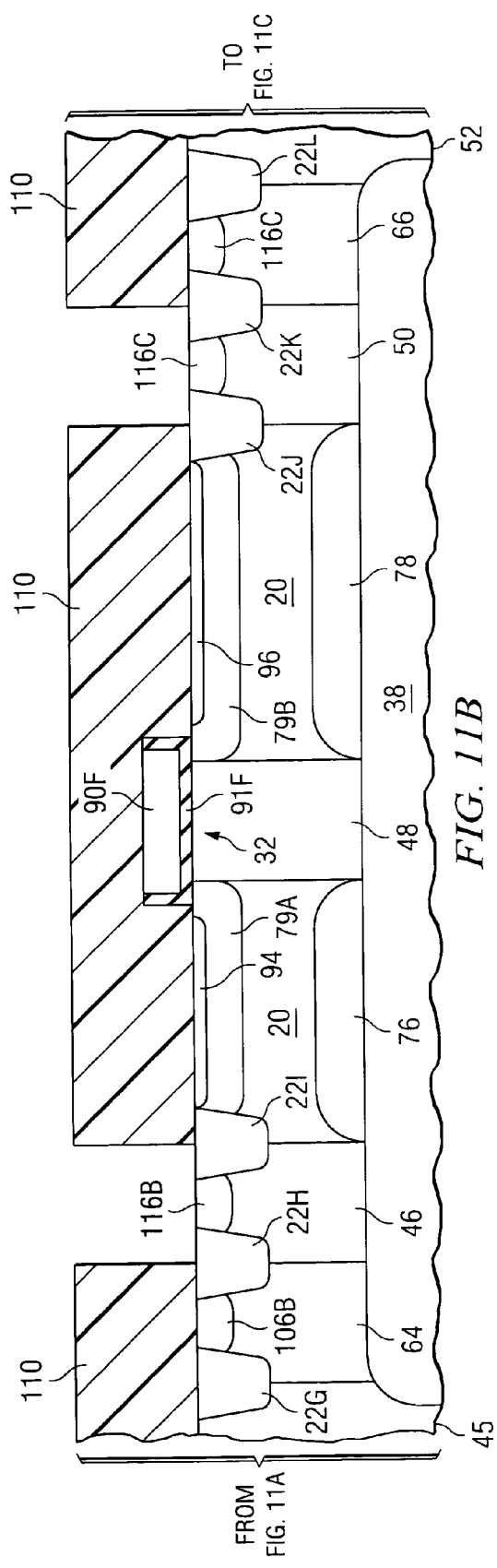
Figure 11C:
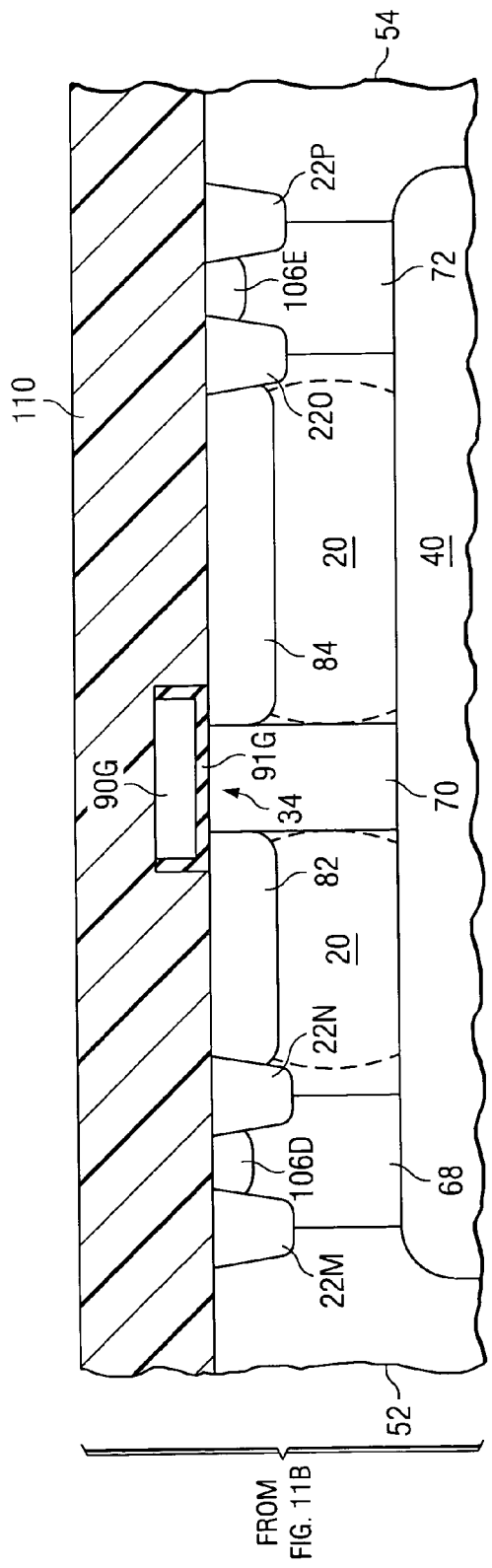

With reference now to FIG. 11, photoresist layer 100 is removed and a new photoresist layer 110 is formed and patterned over the upper surface of the structure exposing the upper surfaces over device regions 26 and 30 and between adjacent pairs of isolation trenches 22A–B, H–I and J–K. Subsequent to patterning the photoresist, a first lightly-doped drain ion implantation of P-type dopant is performed at a dopant level in the range of low e13 and power in the range of 10–30 Kev. A second ion implantation of N-type dopant is performed at a dopant level in the range of high e13 and power in the range of 30–50 Kev, thus forming source and drain regions 112, 114 respectively, in device region 26 and N-type isolation pockets 116A–C between isolation trench pairs 22A–B, H–I, and J–K respectively.

Figure 12A:
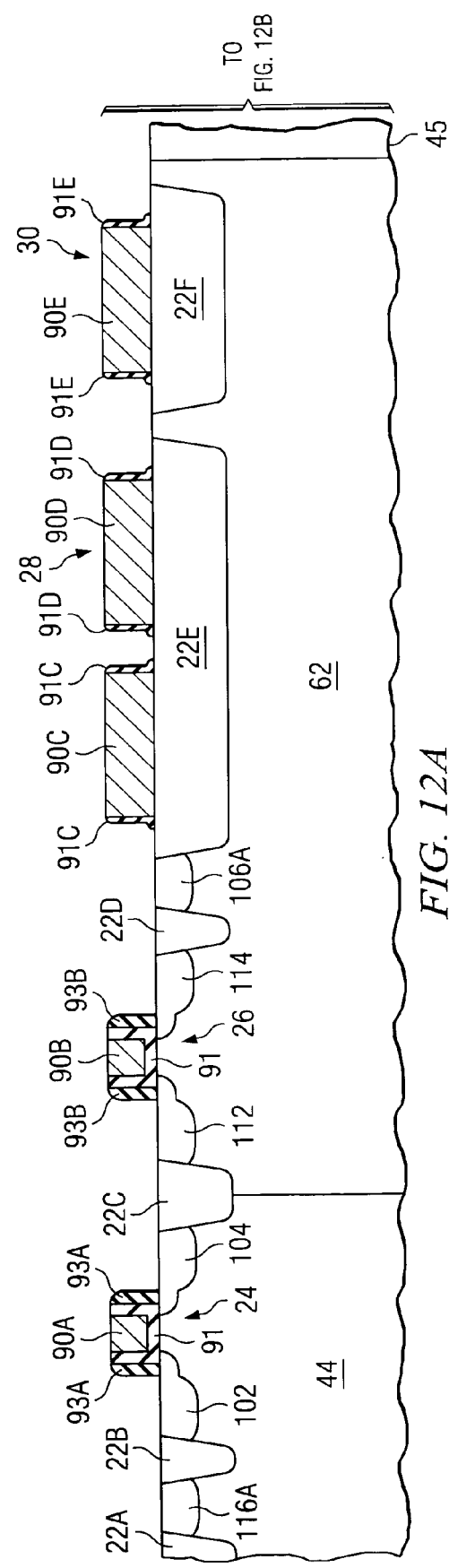

With reference now to FIG. 12, photoresist mask 110 is removed and an oxide layer is deposited conformally over the upper surface of the device, including the polysilicon regions formed above, to a thickness in the range of 120–180 angstroms. A nitride layer is deposited conformally over the upper surface of the device, including the oxide layer, to a thickness in the range of 700–900 angstroms. A conventional anisotropic etching process is performed, for example a conventional plasma etch, removing horizontal oxide and nitride layers on the upper surface of the device, leaving oxide/nitride spacers on the vertical sidewalls of polysilicon regions 90A–G, the sidewalls indicated at 93A–G, respectively. It will be understood by the reader that this sidewall formation process is well known in the art.

Figure 13A:
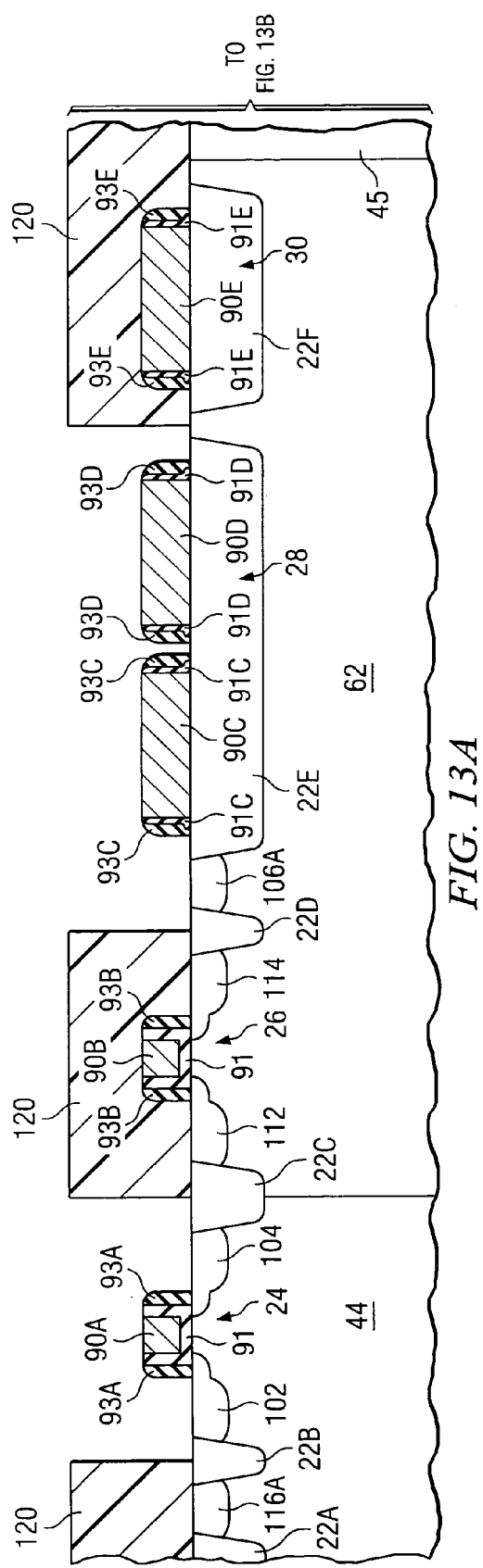
Figure 13B:
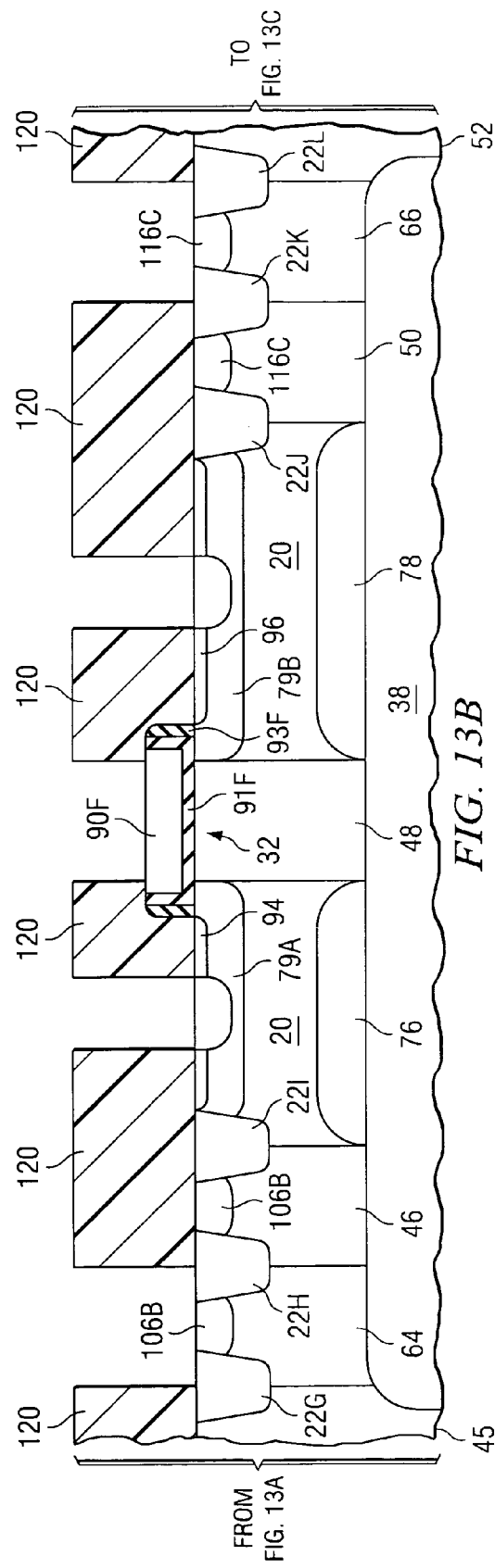
Figure 13C:
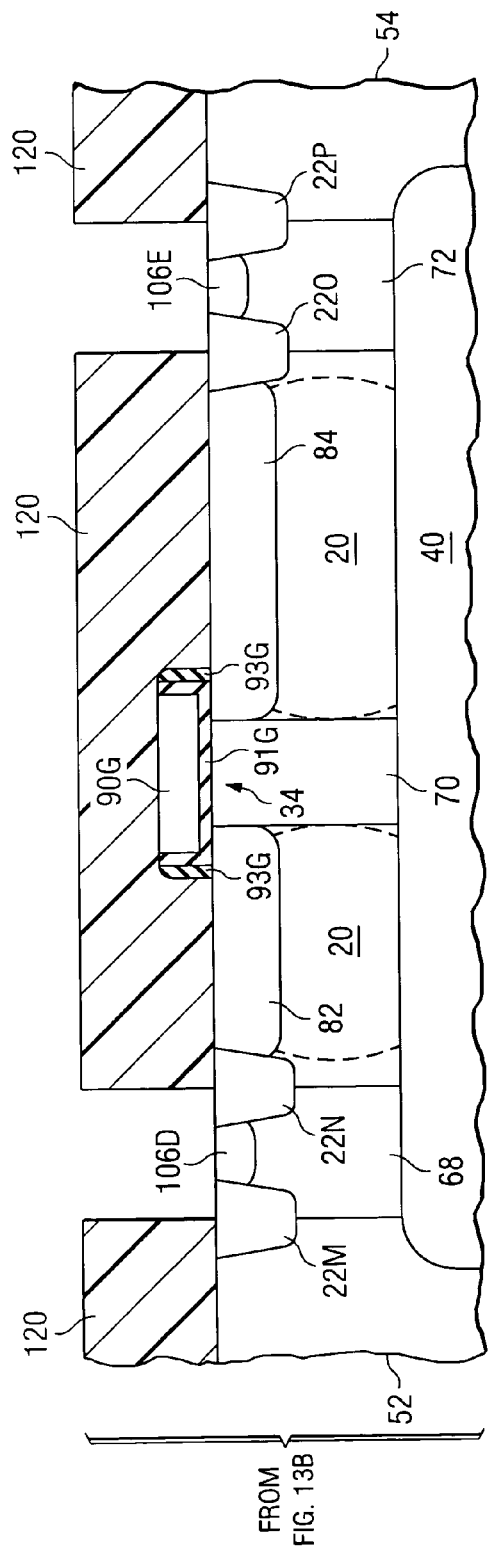

With reference now to FIG. 13, another photoresist masking layer 120 is formed and patterned to expose: i) the upper surfaces of device regions 24 and 28, ii) the isolation regions between adjoining trenches 22D–E, G–H, K–L, M–N and O–P, iii) the central regions of source and drain regions 94, 96 in device region 32, and iv) polysilicon gate 90F. An ion implantation of N-type dopant is performed, for example in a two-step process: i) As at low e 15 and 40–70 Kev, and ii) P31 at mid e13 and 30–60 Kev. This implant creates a highly doped N-type region with which to generate low ohmic contacts to the metallization interconnect.

Figure 14A:
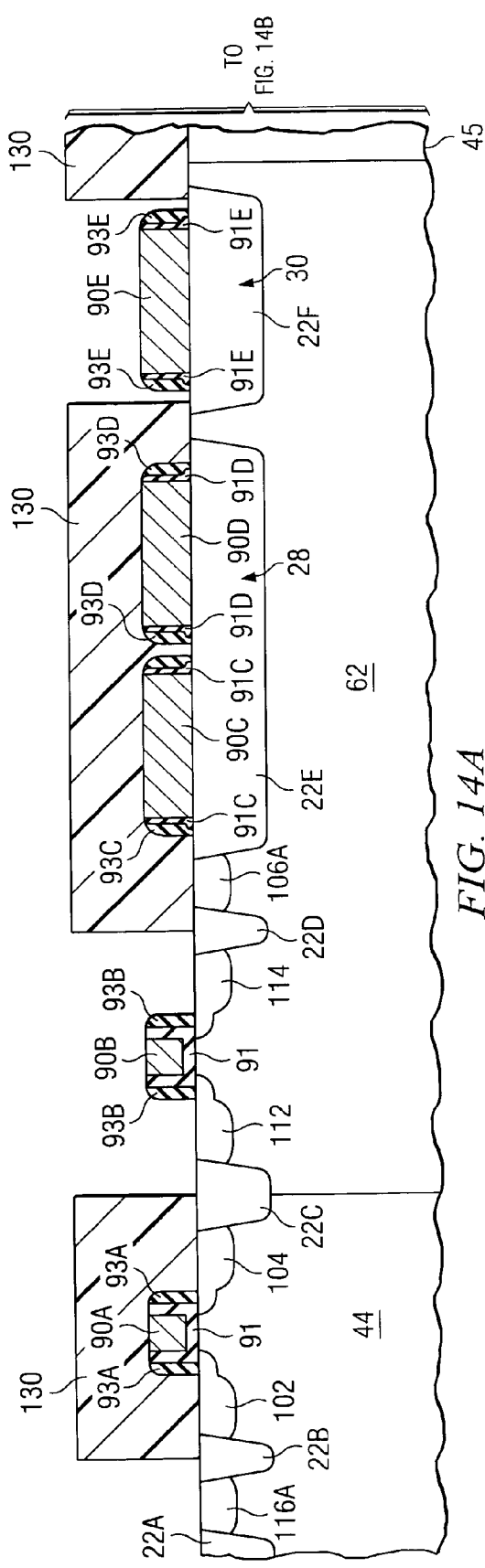
Figure 14B:
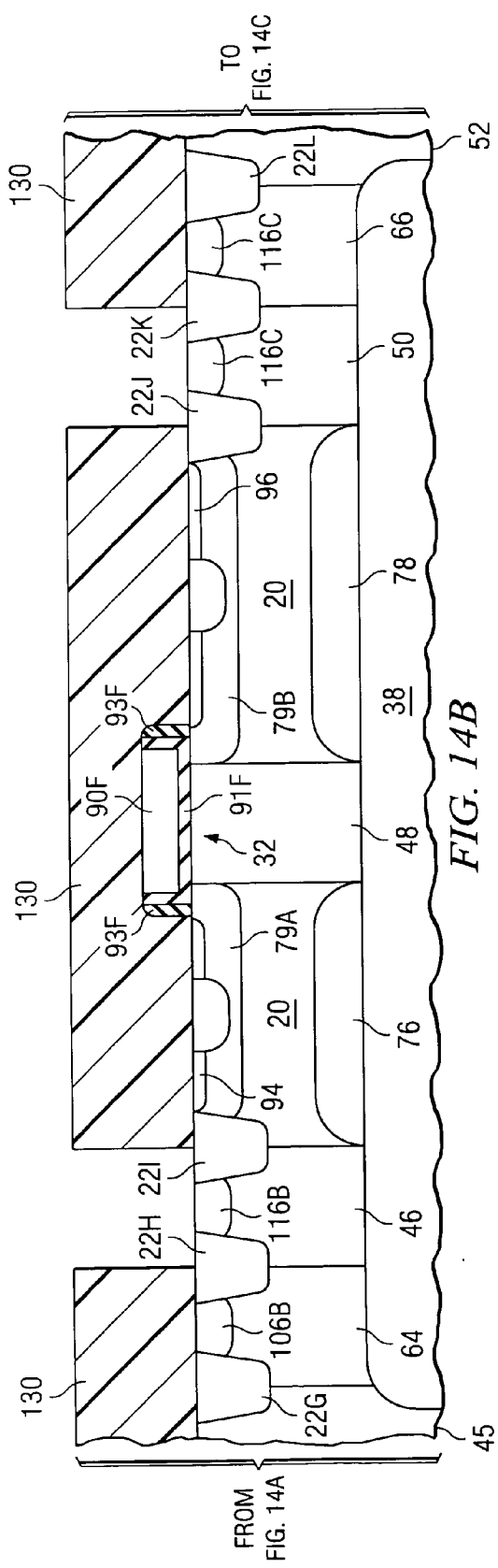
Figure 14C:
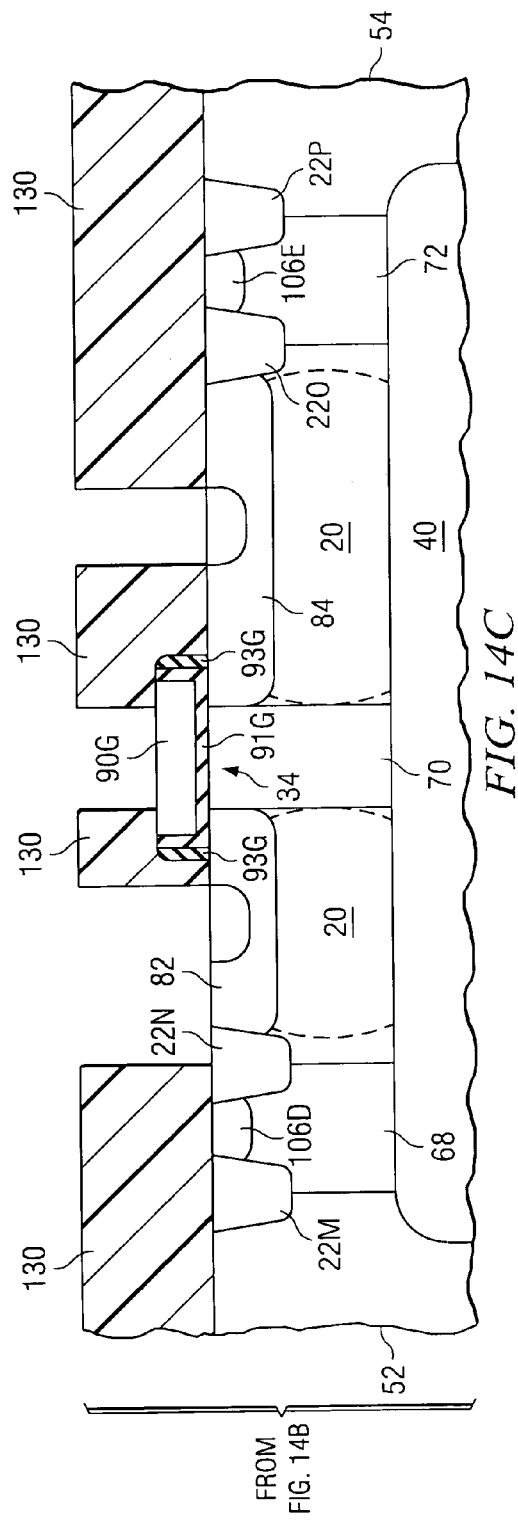

With reference now to FIG. 14, photoresist layer 120 is removed and another photoresist masking layer 130 is formed and patterned to expose: i) the upper surfaces of device regions 26 and 30, ii) the isolation regions between adjoining trenches 22A–B, H–I, J–K, iii) the central regions of source and drain regions 82, 84 in device region 34, and iv) polysilicon gate 90g. An ion implantation of p-type dopant is performed for example in a three-step process: i) high e14 at 5–7 Kev, ii) low e15 at 3–6 Kev, and iii) mid e15 at 10–20 Kev.

With reference now to FIG. 15, photoresist layer 130 is removed and a thermal anneal is performed to activate the source, drain and various other doped regions in the structure. This anneal is performed, for example, with a thermal spike to a temperature in the range of 900–1200 degrees centigrade of sufficient duration to activate the various doped device regions in a conventional manner.

There have thus been formed complimentary low-voltage CMOS transistors and high-voltage CMOS transistors within the same substrate 20 and hence on the same integrated circuit. More particularly, 1.5V NMOS and PMOS transistors, 124 and 126, have been formed respectively in device regions 24 and 26. 20V NMOS and PMOS transistors 132 and 134 have been formed respectively in device regions 32 and 34. A capacitor 128 has been formed in device region 28, while a resistor 130 has been formed in device region 30.

The inclusion of the high-voltage NMOS and PMOS transistors 124, 126 was accomplished through the inclusion of a minimal number of additional process steps, most particularly the formation of P-type buried layers 76 and 78 (see FIG. 5) in NMOS transistor 132 and the relatively heavily doped N-well region 70 (see FIG. 4). The inventive process is completely compatible with the formation of the standard low-voltage CMOS devices 124, 126.

The present invention has application in the electronics industry and particularly in a vast array of applications requiring both low-voltage logic and high-voltage switching and control circuits.

While the invention has been shown and described with respect to particular embodiments, it is not thus limited. Numerous modifications, changes and improvements within the scope of the invention will now occur to the reader.

What is claimed is:

1. A method of forming an integrated circuit chip containing at least one relatively low-voltage NMOS transistor and at least one relatively high voltage NMOS transistor, comprising:

provided a silicon substrate having a first P-well and a second P-well;

forming a low-voltage NMOS transistor in the first P-well including source and drain regions in the surface of the silicon substrate spaced by a gate region;

forming a first buried N-well in the bottom of the second P-well;

forming first and second buried P-layers in the second P-well on the upper surface of the buried N-well; and forming a high-voltage NMOS transistor in the second P-well including source and drain regions in the surface of the silicon substrate, the source and drain regions each spaced from the first and second P-layers and spaced from one-another by a gate region.

2. The method of claim 1 wherein the step of forming the first and second buried P-layers comprises:

forming a mask on the upper surface of the silicon substrate;

using the mask to implant each of the first and second buried P-layers; and using the mask to implant the high-voltage NMOS source and drain regions.

3. The method of claim 2 and further comprising:

forming a first N-well in the silicon substrate;

forming a low-voltage PMOS transistor in the first N-well including source and drain regions in the surface of the silicon substrate spaced by a gate region;

forming a second N-well in the silicon substrate;

forming a second buried N-well in the bottom of the second N-well; and forming a high-voltage PMOS transistor in the second N-well including source and drain regions in the surface of the second N-well, the source and drain regions spaced from the second buried N-well and from one-another by a gate region.

4. The method of claim 3 wherein;

each of the high-voltage NMOS and PMOS transistors is formed to switch up to a 20 volt load; and each of the low-voltage NMOS and PMOS transistors is formed to switch in the range of a 1–5 volt load.

* * * * *